United States Patent
Seong et al.

(10) Patent No.: US 9,640,586 B2
(45) Date of Patent: May 2, 2017

(54) SEMICONDUCTOR DIODES, AND VARIABLE RESISTANCE MEMORY DEVICES

(71) Applicants: Dong-Jun Seong, Seongnam-si (KR); Youn-Seon Kang, Yongin-si (KR)

(72) Inventors: Dong-Jun Seong, Seongnam-si (KR); Youn-Seon Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 14/620,944

(22) Filed: Feb. 12, 2015

(65) Prior Publication Data

US 2015/0372056 A1 Dec. 24, 2015

(30) Foreign Application Priority Data

Jun. 18, 2014 (KR) .................. 10-2014-0074167

(51) Int. Cl.
*H01L 27/24* (2006.01)
*H01L 45/00* (2006.01)
*H01L 27/22* (2006.01)

(52) U.S. Cl.
CPC ........ *H01L 27/2409* (2013.01); *H01L 27/224* (2013.01); *H01L 27/2418* (2013.01); *H01L 27/2463* (2013.01); *H01L 45/04* (2013.01); *H01L 45/06* (2013.01); *H01L 45/1233* (2013.01); *H01L 45/141* (2013.01); *H01L 45/143* (2013.01); *H01L 45/144* (2013.01); *H01L 45/146* (2013.01); *H01L 45/147* (2013.01); *H01L 45/148* (2013.01); *H01L 45/16* (2013.01); *H01L 45/1683* (2013.01)

(58) Field of Classification Search
CPC .......................... H01L 27/2409; H01L 45/141
USPC ......................................................... 257/656
See application file for complete search history.

(56) References Cited

U.S. PATENT DOCUMENTS

| | | | | |
|---|---|---|---|---|
| 4,772,927 | A | * | 9/1988 | Saito ................. H01L 21/32155 257/66 |
| 5,879,955 | A | * | 3/1999 | Gonzalez ............... H01L 45/06 257/2 |
| 8,072,791 | B2 | | 12/2011 | Herner et al. |
| 8,102,694 | B2 | | 1/2012 | Herner et al. |
| 8,318,573 | B2 | | 11/2012 | Malhotra et al. |
| 8,436,331 | B2 | | 5/2013 | Iwakaji et al. |
| 8,450,181 | B2 | * | 5/2013 | Chen ................... H01L 27/1021 438/381 |
| 8,450,715 | B2 | | 5/2013 | Takano et al. |

(Continued)

FOREIGN PATENT DOCUMENTS

JP 2006093338 A 4/2006
JP 2011517364 A 6/2011
(Continued)

*Primary Examiner* — Mark Prenty
(74) *Attorney, Agent, or Firm* — Harness, Dickey & Pierce, P.L.C.

(57) ABSTRACT

A semiconductor diode includes a first semiconductor pattern including a first impurity, a first diffusion barrier pattern on the first semiconductor pattern, an intrinsic semiconductor pattern on the first diffusion barrier pattern, a second diffusion barrier pattern on the intrinsic semiconductor pattern, and a second semiconductor pattern including a second impurity on the second diffusion barrier pattern.

12 Claims, 22 Drawing Sheets

(56) References Cited

U.S. PATENT DOCUMENTS

| | | |
|---|---|---|
| 8,481,989 B2 | 7/2013 | Kai et al. |
| 8,557,685 B2 | 10/2013 | Xu |
| 8,866,124 B2 * | 10/2014 | Maxwell ............ H01L 27/1021 257/1 |
| 2010/0102291 A1 | 4/2010 | Xu |
| 2010/0147379 A1 | 6/2010 | Kishimoto |
| 2011/0146773 A1 | 6/2011 | Nishimura et al. |

FOREIGN PATENT DOCUMENTS

| | | |
|---|---|---|
| JP | 5364407 B2 | 12/2013 |
| KR | 100642196 B1 | 11/2006 |
| KR | 20110080166 A | 7/2011 |
| KR | 101057208 B1 | 8/2011 |
| KR | 101153036 B1 | 8/2012 |

\* cited by examiner

SEMICONDUCTOR DIODES, AND VARIABLE RESISTANCE MEMORY DEVICES

CROSS-REFERENCE TO RELATED APPLICATION

This application claims priority under 35 USC §119 to Korean Patent Application No. 10-2014-0074167, filed on Jun. 18, 2014 in the Korean Intellectual Property Office (KIPO), the contents of which are incorporated by reference herein in their entirety.

BACKGROUND

1. Field

Some example embodiments relate to semiconductor diodes, variable resistance memory devices and/or methods of manufacturing variable resistance memory devices. More particularly, some example embodiments relate to semiconductor diodes including impurities, variable resistance memory devices including the semiconductor diodes and/or methods of manufacturing the variable resistance memory devices.

2. Description of the Related Art

Recently, memory devices having a variable resistance property have been developed. Examples of the memory devices include a resistive random access memory (ReRAM) device, a phase change random access memory (PRAM) device, a magnetic random access memory (MRAM) device, etc.

In the memory devices, a memory cell including a variable resistance layer and a selection device may be disposed between upper and lower electrodes or between upper and lower conductive lines. A semiconductor diode, e.g., a PIN diode, may be used as the selection device. A plurality of the memory cells may be arranged to form an array, and an operational reliability of the selection device at each memory cell may be desired.

SUMMARY

Some example embodiments provide a semiconductor diode having an improved operational reliability.

Other example embodiments provide a variable resistance memory device having an improved operational reliability.

Other example embodiments provide a method of manufacturing a variable resistance memory device having an improved operational reliability.

According to an example embodiment, a semiconductor diode includes a first semiconductor pattern including a first impurity, a first diffusion barrier pattern on the first semiconductor pattern, an intrinsic semiconductor pattern on the first diffusion barrier pattern, a second diffusion barrier pattern on the intrinsic semiconductor pattern, and a second semiconductor pattern on the second diffusion barrier pattern, the second semiconductor pattern including a second impurity.

In an example embodiment, the first diffusion barrier pattern and the second diffusion barrier pattern may include a semiconductor material containing a diffusion barrier dopant.

In an example embodiment, the first diffusion barrier pattern and the second diffusion barrier pattern may include at least one of polysilicon doped with carbon, and silicon carbide.

In an example embodiment, the first impurity may include an n-type impurity and the second impurity may include a p-type impurity.

According to another example embodiment, a semiconductor diode includes a first semiconductor pattern including a first impurity, an intrinsic semiconductor pattern on the first semiconductor pattern, a second semiconductor pattern on the intrinsic semiconductor pattern, the second semiconductor pattern including a second impurity, and a plurality of dopant regions distributed throughout the first semiconductor pattern, the intrinsic semiconductor pattern and the second semiconductor pattern.

In another example embodiment, the dopant regions may include carbon.

In another example embodiment, the dopant regions may include a first dopant region at a region adjacent to an interface of the first semiconductor pattern and the intrinsic semiconductor pattern, and a second dopant region at a region adjacent to an interface of the second semiconductor pattern and the intrinsic semiconductor pattern.

In another example embodiment, a concentration of the dopant regions may decrease as a distance from the interface of the first semiconductor pattern, the intrinsic semiconductor pattern and the second semiconductor pattern increases.

In another example embodiment, the dopant regions may correspond with maximum concentration peaks of a dopant in the semiconductor diode.

According to example embodiments, a variable resistance memory device includes a plurality of first conductive lines extending in a first direction, a plurality of second conductive lines over the first conductive lines, the second conductive lines extending in a second direction crossing the first direction, and a plurality of memory cells at intersection regions of the first conductive lines and the second conductive lines. Each of the memory cells includes a semiconductor diode and a variable resistance pattern on the semiconductor diode. The semiconductor diode includes a first semiconductor pattern, a first diffusion barrier pattern, an intrinsic semiconductor pattern, a second diffusion barrier pattern and a second semiconductor pattern sequentially stacked on the first conductive line. The first semiconductor pattern includes a first impurity and the second semiconductor pattern includes a second impurity.

In another example embodiment, the first diffusion barrier pattern and the second diffusion barrier pattern may include at least one of polysilicon doped with carbon, and silicon carbide.

In another example embodiment, the variable resistance pattern may include one of a perovskite-based material and a transition metal oxide.

In another example embodiment, the variable resistance pattern may include a chalcogenide-based material.

In another example embodiment, the variable resistance memory device may further include a spacer surrounding a sidewall of the semiconductor diode.

In another example embodiment, the spacer may include a carbon-containing insulation material.

In another example embodiment, the spacer may include one of silicon carbooxide and silicon carbonitride.

In another example embodiment, the spacer may include a first spacer on sidewalls of the memory cells and the first conductive lines, and a second spacer on sidewalls of the memory cells and the second conductive lines.

In another example embodiment, the variable resistance memory device may further include an insulation layer pattern on the spacer and surrounding the memory cells. The insulation layer pattern may define an air gap between the memory cells neighboring each other.

In another example embodiment, the air gap may include a first air gap extending in the first direction and a second air gap extending in the second direction.

According to still another example embodiment, a variable resistance memory device includes a plurality of first conductive lines extending in a first direction, a plurality of second conductive lines over the first conductive lines and extending in a second direction crossing the first direction, and a plurality of memory cells at intersection regions of the first conductive lines and the second conductive lines. Each of the memory cells includes a semiconductor diode and a variable resistance pattern on the semiconductor diode. The semiconductor diode includes a first semiconductor pattern, an intrinsic semiconductor pattern and a second semiconductor pattern sequentially stacked on the first conductive line, and a plurality of dopant regions distributed throughout the first semiconductor pattern, the intrinsic semiconductor pattern and the second semiconductor pattern. The first semiconductor pattern includes a first impurity and the second semiconductor pattern includes a second impurity.

In still another example embodiment, the dopant regions may include a first dopant region at a region adjacent to an interface of the first semiconductor pattern and the intrinsic semiconductor pattern, and a second dopant region at a region adjacent to an interface of the second semiconductor pattern and the intrinsic semiconductor pattern. The first and second dopant regions may include carbon. In still another example embodiment, the dopant regions may correspond with maximum concentration peaks of a dopant in the semiconductor diode.

According to example embodiments, there is provided a method of manufacturing a variable resistance memory device. In the method, a first conductive layer is formed on a base insulation layer. A first semiconductor layer, a first diffusion barrier layer, an intrinsic semiconductor layer, a second diffusion barrier layer, a second semiconductor layer and a variable resistance material layer are sequentially stacked on the first conductive layer to form a layer structure. The layer structure and the first conductive layer are partially etched to form a plurality of first openings extending in a first direction. A first insulation layer pattern filling the first openings is formed. A second conductive layer is formed on the layer structure and the first insulation layer pattern. The second conductive layer, the layer structure and the first insulation layer pattern are partially etched to form a plurality of second openings extending in a second direction that crosses the first direction.

In still another example embodiment, the first diffusion barrier layer and the second diffusion barrier layer may be formed by one of an ion-implantation process and a selective epitaxial growth (SEG) process including doping the first semiconductor layer and the intrinsic semiconductor layer with a carbon-containing dopant.

In still another example embodiment, before forming the first diffusion barrier layer, a top surface of the first semiconductor layer may be cleaned with an acid solution.

In still another example embodiment, a first impurity may be implanted into the first semiconductor layer and a second impurity may be implanted into the second semiconductor layer.

In still another example embodiment, before forming the first insulation layer pattern, a first spacer may be further formed on a sidewall of the first openings.

In still another example embodiment, a first air gap may be formed in the first insulation layer pattern.

In still another example embodiment, the first spacer may include a carbon-containing insulation material.

In still another example embodiment, a second spacer may be further formed on a sidewall of the second openings.

In still another example embodiment, a second insulation layer pattern which fills the second opening may be further formed on the second spacer. A second air gap may be in the second insulation layer pattern.

According to yet another example embodiment, there is provided a method of manufacturing a variable resistance memory device. In the method, a first conductive line is formed on a substrate. An insulating interlayer covering the first conductive line is formed on the substrate. The insulating interlayer is partially removed to form a plurality of openings exposing the first conductive line. A first semiconductor pattern, a first diffusion barrier pattern, an intrinsic semiconductor pattern, a second diffusion barrier pattern and a second semiconductor pattern are sequentially formed in each of the openings to form a semiconductor diode. A phase change material pattern is formed on the semiconductor diode. A second conductive line is formed on the phase change material pattern.

In yet another example embodiment, in forming the first conductive line, impurities may be implanted into an upper portion of the substrate.

In yet another example embodiment, the first semiconductor pattern may be formed by a SEG process from the first conductive line.

In yet another example embodiment, the first semiconductor pattern and the first conductive line include a first impurity, and the second semiconductor pattern includes a second impurity different from the first impurity.

In yet another example embodiment, the first diffusion barrier pattern and the second diffusion barrier pattern may be formed by one of an ion-implantation process and a SEG process including doping the first semiconductor pattern and the intrinsic semiconductor pattern with a carbon-containing dopant is used on the first semiconductor pattern and the intrinsic semiconductor pattern, respectively.

In yet another example embodiment, the insulating interlayer may be removed. A spacer may be formed on a sidewall of the semiconductor diode. An insulation layer covering the semiconductor diode may be formed. The insulation layer may include an air gap between the semiconductor diodes neighboring each other.

According to still yet another example embodiment, a semiconductor diode includes a first semiconductor pattern doped with a first type impurity and a second semiconductor pattern doped with a second type impurity different than the first type impurity, an intrinsic semiconductor pattern between the first and second semiconductor patterns, and carbon doped regions at an interface of the intrinsic semiconductor pattern and each of the first and second semiconductor patterns.

In still yet another example embodiment, the carbon doped regions may include at least one of polysilicon doped with carbon, and silicon carbide.

In still yet another example embodiment, the first type impurity may include an n-type impurity and the second type impurity may include a p-type impurity.

In still yet another example embodiment, a concentration of the carbon doped regions may decrease as a distance from the interface of the intrinsic semiconductor pattern and each of the first and second semiconductor patterns increases.

In still yet another example embodiment, the carbon doped regions may correspond with maximum concentration peaks of a dopant in the semiconductor diode.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor diode in accordance with example embodiments;

FIG. 2 is a cross-sectional view illustrating a semiconductor diode in accordance with example embodiments;

FIG. 3 is a top plan view illustrating a variable resistance memory device in accordance with example embodiments;

FIGS. 4 and 5 are cross-sectional views taken along lines I-I' and II-II', respectively, of FIG. 3;

FIGS. 6 to 14 are cross-sectional views illustrating a method of manufacturing a variable resistance memory device in accordance with example embodiments;

FIGS. 15 and 16 are cross-sectional views illustrating a variable resistance memory device in accordance with example embodiments;

FIGS. 17 to 22 are cross-sectional views illustrating a method of manufacturing a variable resistance memory device in accordance with example embodiments;

FIG. 23 is a cross-sectional view illustrating a variable resistance memory device in accordance with example embodiments;

FIGS. 24 to 31 are cross-sectional views illustrating a method of manufacturing a variable resistance memory device in accordance with example embodiments;

FIG. 32 is a cross-sectional view illustrating a variable resistance memory device in accordance with example embodiments;

FIGS. 33 to 40 are cross-sectional views illustrating a method of manufacturing a variable resistance memory device in accordance with example embodiments; and FIG. 41 is a block diagram illustrating a schematic construction of an information processing system in accordance with example embodiments.

DETAILED DESCRIPTION

Figure 1:
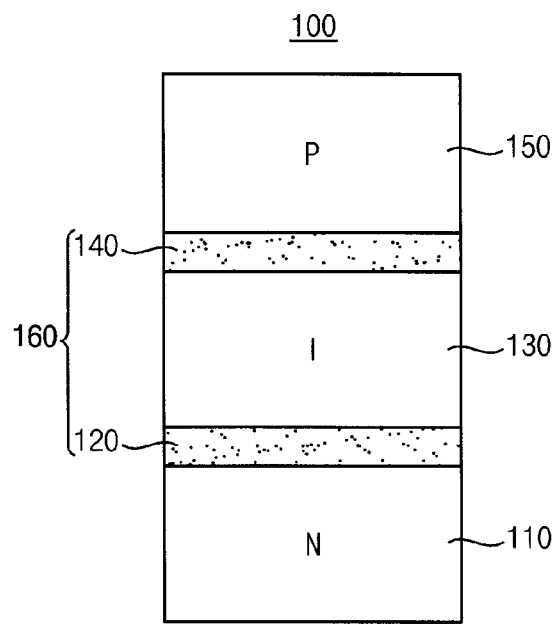
FIGS. 1 to 41 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor diode in accordance with example embodiments. For example, FIG. 1 illustrates a semiconductor diode having a PIN structure.

Referring to FIG. 1, a semiconductor diode 100 may include a first semiconductor pattern 110, an intrinsic semiconductor pattern 130 and a second semiconductor pattern 150. The semiconductor diode 100 may further include diffusion barrier patterns 160 disposed between the first semiconductor pattern 110 and the intrinsic semiconductor pattern 130, and between the second semiconductor pattern 150 and the intrinsic semiconductor pattern 130.

The first semiconductor pattern 110 may include a semiconductor material containing a first impurity. In example embodiments, the first impurity may include an n-type impurity such as phosphorous (P) or arsenic (As). The semiconductor material may include a silicon-based material or a germanium-based material. In an example embodiment, the first semiconductor pattern 110 may include polysilicon containing arsenic.

The second semiconductor pattern 150 may include a semiconductor material containing a second impurity. In example embodiments, the second impurity may include a p-type impurity such as boron (B) or indium (In). In an example embodiment, the second semiconductor pattern 150 may include polysilicon containing boron.

The intrinsic semiconductor pattern 130 may include a semiconductor material such as polysilicon. In an example embodiment, the intrinsic semiconductor pattern 130 may not substantially include the p-type and n-type impurities.

In some embodiments, the intrinsic semiconductor pattern 130 may include the first or second impurity, a concentration of which may be lower than that of the first semiconductor pattern 110 or the second semiconductor pattern 150. For example, the intrinsic semiconductor pattern 130 may include the impurity at a relatively small level so that the impurity in the intrinsic semiconductor pattern 130 may not affect an operation of the semiconductor diode 100.

The diffusion barrier patterns 160 may be interposed between the semiconductor patterns. In example embodiments, the diffusion barrier patterns 160 may include a first diffusion barrier pattern 120 formed between the first semiconductor pattern 110 and the intrinsic semiconductor pattern 130, and a second diffusion barrier pattern 140 formed between the intrinsic semiconductor pattern 130 and the second semiconductor pattern 150.

In example embodiments, the diffusion barrier pattern 160 may include a semiconductor material containing a diffusion barrier dopant. The diffusion barrier dopant may include carbon. In an example embodiment, the diffusion barrier pattern 160 may include polysilicon doped with carbon. In an example embodiment, the diffusion barrier pattern 160 may include silicon carbide.

As described above, the diffusion barrier pattern 160 may include the dopant that may have relatively low diffusivity or mobility such as carbon. The dopant may prevent or inhibit the n-type and p-type impurities included in the first and second semiconductor patterns 110 and 150 from being diffused into the intrinsic semiconductor pattern 130 to be mixed or adulterated with each other. Thus, interfaces of the semiconductor diode 100, e.g., a p-i interface and an n-i interface, may be clearly defined, and a leakage current at the interfaces may be avoided.

Figure 2:
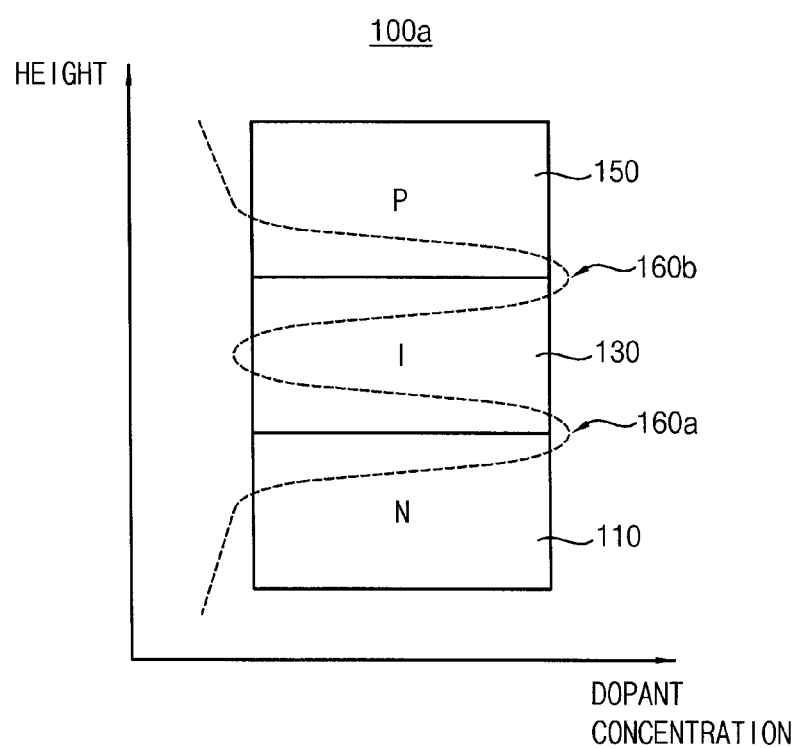

FIG. 2 is a cross-sectional view illustrating a semiconductor diode in accordance with example embodiments. For a convenience of descriptions, FIG. 2 illustrates a plurality of dopant regions using a concentration distribution graph.

Referring to FIG. 2, as described with reference to FIG. 1, a semiconductor pattern 100a may include a first semiconductor pattern 110, an intrinsic semiconductor pattern 130 and a second semiconductor pattern 150 sequentially stacked on each other.

A dopant including, e.g., carbon, may be contained in the semiconductor diode 100a with a distribution indicated as a dotted line of FIG. 2. Accordingly, a plurality of dopant regions of which a concentration may be increased and decreased repeatedly along a height direction of the semiconductor diode 100a may be formed. According to one example embodiment, the dopant regions may be maximum dopant regions, the maximum dopant regions corresponding with maximum concentration peaks of the dopant in the semiconductor diode 100a.

As illustrated in FIG. 2, the semiconductor diode 100a may include a first dopant region 160a and a second dopant region 160b. The first dopant region 160a may be formed at a region adjacent to an interface between the first semiconductor pattern 110 and the intrinsic semiconductor pattern 130. For example, the first dopant region 160a may be formed at a region adjacent to an n-i interface. In an example embodiment, the first dopant region 160a may be formed throughout an upper portion of the first semiconductor pattern 110 and a lower portion of the intrinsic semiconductor pattern 130.

The second dopant region 160b may be formed at a region adjacent to an interface between the second semiconductor pattern 150 and the intrinsic semiconductor pattern 130. For example, the second dopant region 160b may be formed at a region adjacent to a p-i interface. In an example embodiment, the second dopant region 160b may be formed throughout a lower portion of the second semiconductor pattern 150 and an upper portion of the intrinsic semiconductor pattern 130. In example embodiments, the concentration of the dopant regions may be reduced as a distance from the interface becomes increased.

The first and second dopant regions 160a and 160b may substantially serve as the first and second diffusion barrier patterns 120 and 140, respectively, of FIG. 1.

According to example embodiments, a diffusion of the impurities occurring at the interfaces of the semiconductor patterns may be suppressed by a plurality of the dopant regions so that an operational deterioration of the semiconductor diode due to a leakage current may be prevented or inhibited.

Figure 3:
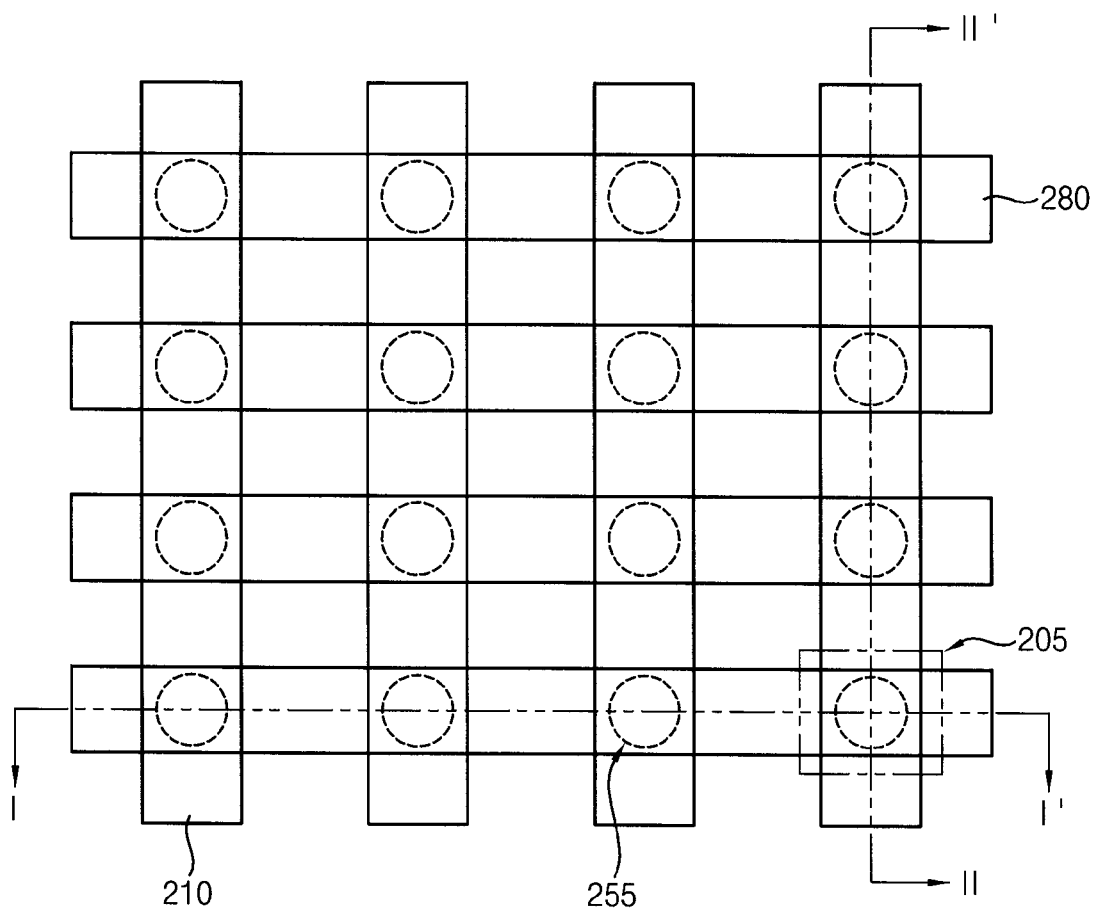
Figure 4:
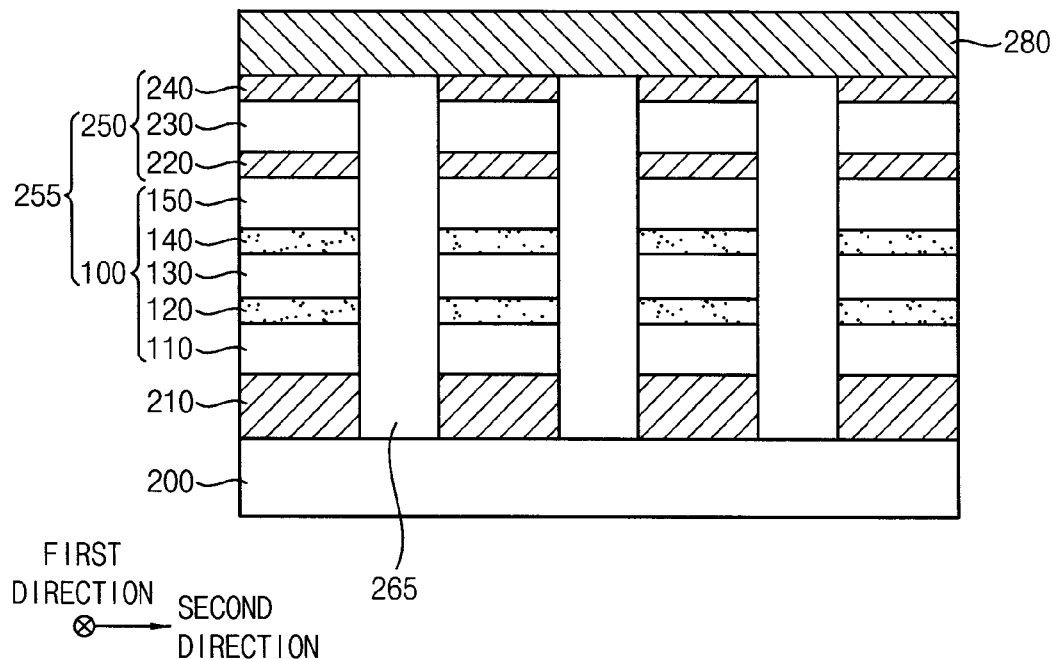
Figure 5:
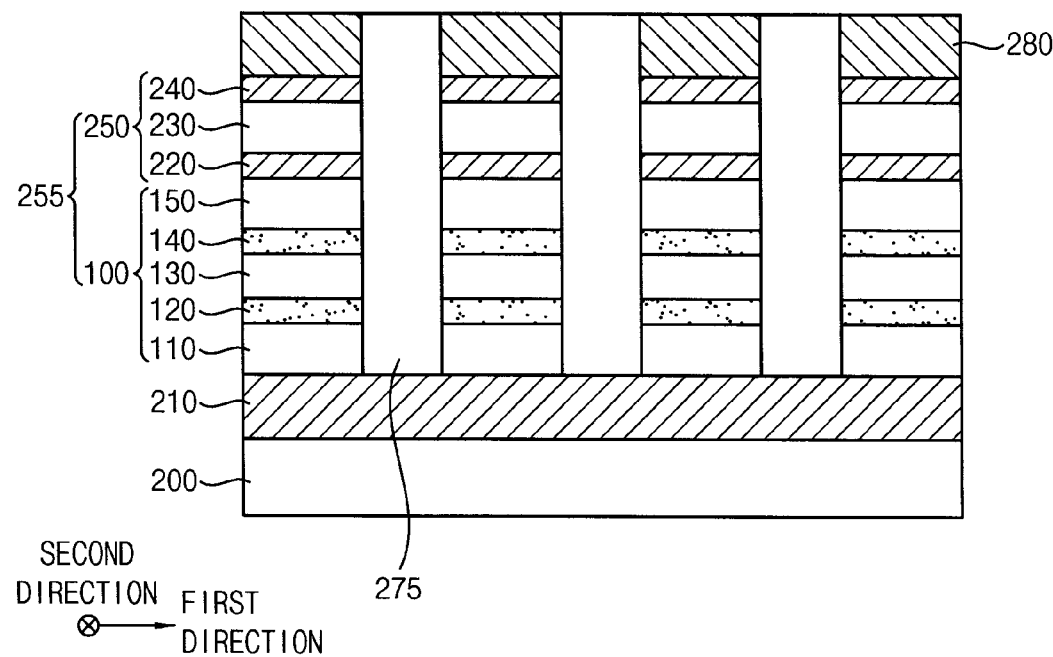

FIG. 3 is a top plan view illustrating a variable resistance memory device in accordance with example embodiments. FIGS. 4 and 5 are cross-sectional views taken along lines I-I' and II-II', respectively, of FIG. 3.

For example, FIGS. 3 to 5 illustrate a non-volatile resistive random access memory (ReRAM) device. The ReRAM device may have a cross-point array structure in which a memory cell including one selection device and one variable resistance device may be located at each intersection region of conductive lines.

For a convenience of descriptions, FIG. 3 illustrates only a first conductive line, a second conductive line and a memory cell, and other elements are omitted for brevity and clarity.

Referring to FIGS. 3 to 5, the variable resistance memory device may include a plurality of first conductive lines 210 and a plurality of second conductive lines 280. The second conductive lines 280 may be disposed over the first conductive lines 210, and the first and second conductive lines 210 and 280 may cross each other. A memory cell 255 may be located at an intersection region 205 of the first and second conductive lines 210 and 280.

The variable resistance memory device may further include a first insulation layer pattern 265 and a second insulation layer pattern 275 crossing each other and extending between the neighboring memory cells 255.

The first conductive line 210 may extend in a first direction on a base insulation layer 200. For example, the first conductive line 210 may extend in the first direction that is substantially parallel to a top surface of the base insulation layer 200, and a plurality of the first conductive lines 210 may be arranged in a second direction that is substantially parallel to the top surface of the base insulation layer 200.

In example embodiments, the first and second directions may be substantially perpendicular to each other. In an example embodiment, the first and second directions may cross each other by a given (or, alternatively predetermined) acute angle. The definitions of the first and second directions are the same throughout the specification.

The base insulation layer 200 may include an insulation material, for example, silicon oxide, silicon nitride or silicon oxynitride. The base insulation layer 200 may cover lower structures such as a transistor formed on a substrate, e.g., a semiconductor substrate.

The first conductive line 210 may include a metal, for example, tungsten (W), copper (Cu), aluminum (Al), titanium (Ti) or tantalum (Ta). In example embodiments, the first conductive line 210 may serve as a word line.

The second conductive line 280 may be disposed over the first conductive line 210 and may extend in the second direction. A plurality of the second conductive lines 280 may be arranged in the first direction. The second conductive line 280 may include a metal, for example, W, Cu, Al, Ti or Ta. In example embodiments, the second conductive line 280 may serve as a bit line.

The memory cell 255 may be disposed at the intersection region 205 at which the first and second conductive lines 210 and 280 overlap or cross each other. In example embodiments, a plurality of the memory cells 255 may be arranged along the first and second directions to form a cross-point array.

The memory cell 255 may have a "1S+1R" structure in which one selection device 100 and one resistance device 250 may be included.

In example embodiments, a semiconductor diode may be used as the selection device 100. The semiconductor diode may have elements and constructions substantially the same as or similar to those of the semiconductor diode illustrated in FIG. 1.

As described above, the semiconductor diode may include a first semiconductor pattern 110, an intrinsic semiconductor diode 130 and a second semiconductor pattern 150 sequentially stacked on the first conductive line 210. The semiconductor diode may further include a first diffusion barrier pattern 120 interposed between the first semiconductor pattern 110 and the intrinsic semiconductor pattern 130, and a second diffusion barrier pattern 140 interposed between the second semiconductor pattern 150 and the intrinsic semiconductor pattern 130.

For example, the first and second semiconductor patterns 110 and 150 may include semiconductor materials containing a first impurity and a second impurity, respectively. In an example embodiment, the first and second semiconductor patterns 110 and 150 may include polysilicon containing n-type and p-type impurities, respectively.

The first and second diffusion barrier patterns 120 and 140 may include a semiconductor material containing a dopant. For example, the first and second diffusion barrier patterns 120 and 140 may include polysilicon doped with carbon or silicon carbide. The first and second diffusion barrier patterns 120 and 140 may suppress the first and second impurities from being diffused into the intrinsic semiconductor pattern 130 to be mixed or adulterated with each other.

In some embodiments, the semiconductor diode may have elements and constructions substantially the same as or similar to those of the semiconductor diode 100a illustrated with reference to FIG. 2. For example, a dopant containing carbon may be distributed along a height direction of the semiconductor diode to form a plurality of dopant regions.

In example embodiments, the dopant regions may include a first dopant region formed at a region adjacent to an interface of the first semiconductor pattern 110 and the intrinsic semiconductor pattern 130, and a second dopant region formed at a region adjacent to an interface of the second semiconductor pattern 150 and the intrinsic semiconductor pattern 130.

The resistance device 250 including a variable resistance pattern 230 may be disposed on the selection device 100. The variable resistance pattern 230 may include a material, the resistance of which may be changed by an oxygen vacancy or an oxygen migration.

For example, the variable resistance pattern 230 may include a perovskite-based material or a transition metal oxide. The perovskite-based material may include, for example, STO ($SrTiO_3$), BTO ($BaTiO_3$) or PCMO ($Pr_{1-X}CaXMnO_3$). The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in a combination thereof.

The variable resistance pattern 230 may have a multi-layered structure including a plurality of the above-mentioned materials. For example, the variable resistance pattern 230 may include a first hafnium oxide ($HfO_2$) layer, a second hafnium oxide (HfOx) layer and a zirconium oxide layer. Alternatively, the variable resistance pattern 230 may include a titanium aluminum oxide (TiAlOx) layer, a tantalum oxide layer and an aluminum oxide layer.

In example embodiments, the resistance device 250 may include a lower electrode 220 interposed between the selection device 100 and the variable resistance pattern 230, and an upper electrode 240 interposed between the second conductive line 280 and the variable resistance pattern 230.

The lower electrode 220 and the upper electrode 240 may include a metal nitride or a metal silicon nitride such as titanium nitride (TiNx), titanium silicon nitride (TiSiNx), tungsten nitride (WNx), tungsten silicon nitride (WSiNx), tantalum nitride (TaNx), tantalum silicon nitride (TaSiNx), zirconium nitride (ZrNx) or zirconium silicon nitride (ZrSiNx).

A plurality of the memory cells 255 may be arranged in the first direction to form a memory cell column. A plurality of the memory cell columns may be arranged in the second direction.

A plurality of the memory cells 255 may be arranged in the second direction to form a memory cell row. A plurality of the memory cell rows may be arranged in the first direction.

The first insulation layer pattern 265 may be formed between the memory cell columns neighboring each other. The first insulation layer pattern 265 may extend in the first direction. In this case, the first conductive line 210 and the first insulation layer pattern 265 may extend in substantially the same direction. As illustrated in FIG. 4, the first conductive lines 210 may be insulated or physically separated from each other by the first insulation layer patterns 265.

In an example embodiment, the first insulation layer pattern 265 may extend partially through an upper portion of the base insulation layer 200. In this case, the first insulation layer pattern 265 may be inserted in the upper portion of the base insulation layer 200.

The second insulation layer pattern 275 may be formed between the memory cell rows neighboring each other. The second insulation layer pattern 275 may extend in the second direction. In this case, the second conductive line 280 and the second insulation layer pattern 275 may extend in substantially the same direction. As illustrated in FIG. 5, the second conductive lines 280 may be insulated or physically separated from each other by the second insulation layer patterns 275.

In an example embodiment, the second insulation layer pattern 275 may extend partially through an upper portion of the first conductive line 210. In this case, the second insulation layer pattern 275 may be inserted in the upper portion of the first conductive line 210.

The first and second insulation layer patterns 265 and 275 may extend to cross each other. Each of the memory cells 255 may be surrounded by the first and second insulation layer patterns 265 and 275. Thus, the neighboring memory cells 255 may be insulated from each other by the first and second insulation layer patterns 265 and 275.

The first and second insulation layer patterns 265 and 275 may include a silicon oxide-based insulation material which has desirable step coverage or gap-fill property. For example, the first and second insulation layer patterns 265 and 275 may include a middle temperature oxide (MTO), a high temperature oxide (HTO) or an atomic layer deposition (ALD) oxide.

According to example embodiments of the present inventive concepts, the selection device 100 included in each memory cell 255 may include the diffusion barrier patterns 120 and 140. Thus, a leakage current and a deterioration of an operational property of, e.g., a semiconductor diode may be prevented or inhibited. Accordingly, a reliable selection of the memory cell 255 may be realized, and an interference and a cross-talk between the memory cells 255 due to the leakage current may be avoided.

As described above, the variable resistance memory device may be implanted to the ReRAM device.

In an example embodiment, the variable resistance pattern 230 may include a material, the resistance of which may be changed through a phase change or a phase transition. For example, the variable resistance pattern 230 may include a chalcogenide-based material in which germanium (Ge), antimony (Sb) and/or tellurium (Te) are combined by a given (or, alternatively predetermined) ratio. In such an embodiment, the variable resistance memory device may be implemented to a PRAM device.

In an example embodiment, the variable resistance pattern 230 may include a material, the resistance of which may be changed by a magnetic field or spin transfer torque (STT). For example, the variable resistance pattern 230 may include a ferromagnetic material such as iron (Fe), nickel (Ni), cobalt (Co), dysprosium (Dy) or gadolinium (Gd). In such an embodiment, the variable resistance memory device may be implemented to an MRAM device.

FIGS. 6 to 14 are cross-sectional views illustrating a method of manufacturing a variable resistance memory device in accordance with example embodiments. For example, FIGS. 6 to 14 illustrate a method of manufacturing the variable resistance memory device of FIGS. 3 to 5.

Figure 13:
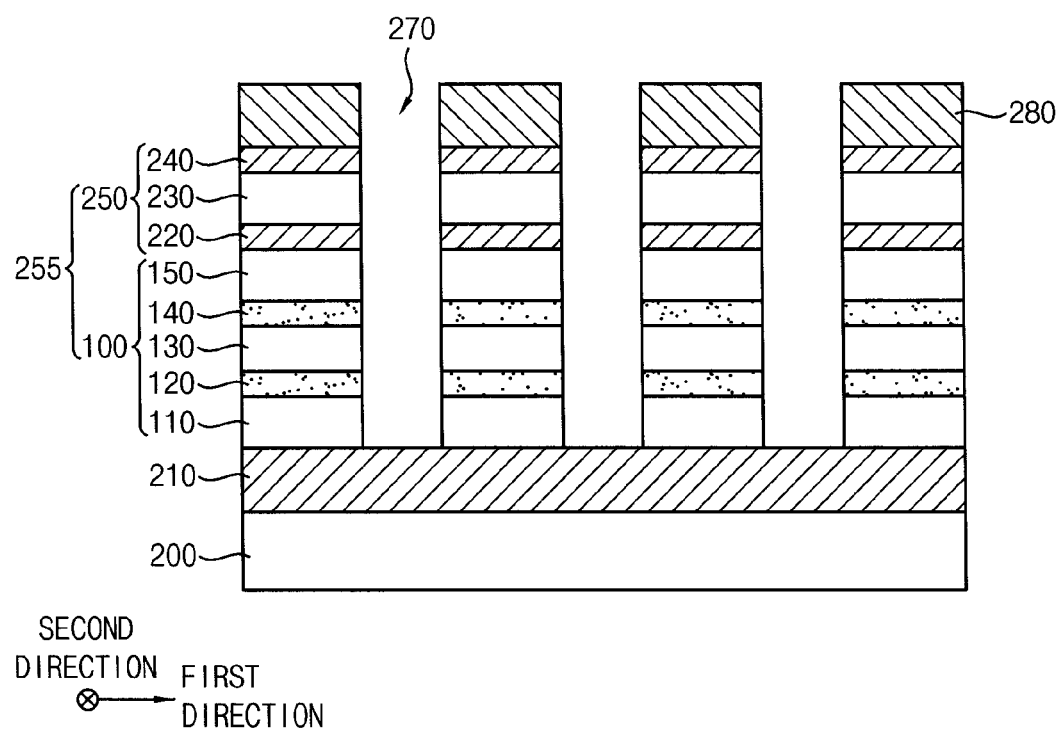
Figure 14:
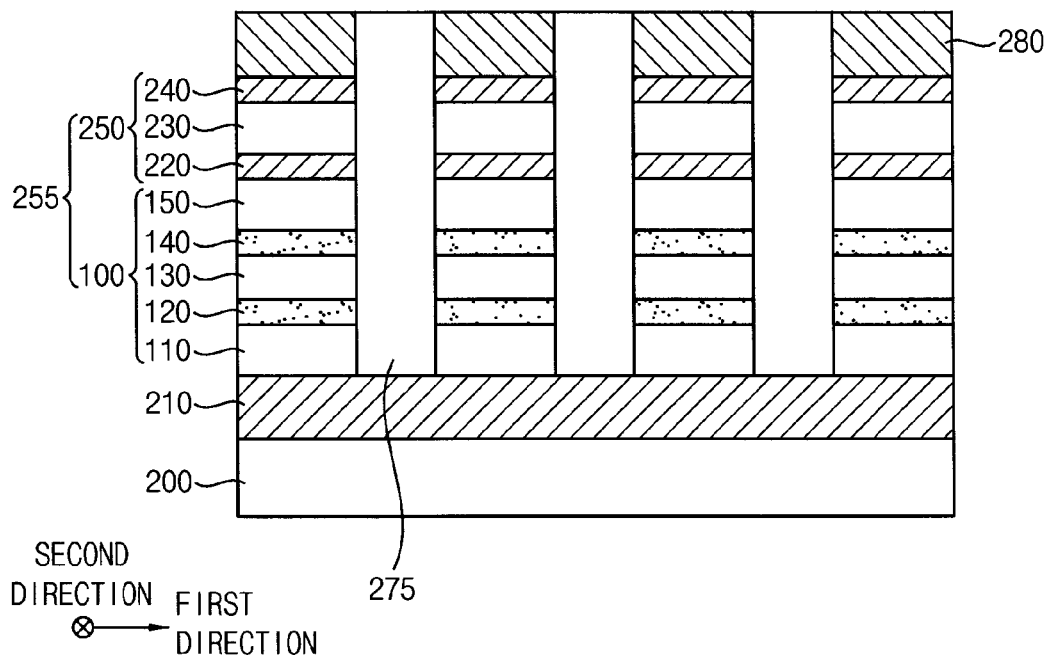

Specifically, FIGS. 6 to 12 are cross-sectional views taken along a line I-I' indicated in FIG. 3. FIGS. 13 and 14 are cross-sectional views taken along a line II-II' indicated in FIG. 3.

Figure 6:
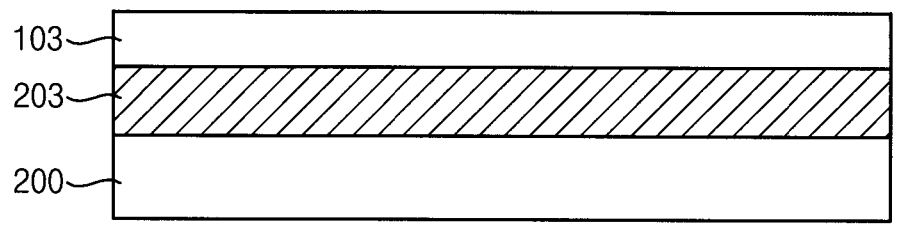

Referring to FIG. 6, a first conductive layer 203 and a first preliminary semiconductor layer 103 may be formed on a base insulation layer 200.

The base insulation layer 200 may include an insulation material, for example, silicon oxide, silicon nitride or silicon oxynitride. The base insulation layer 200 may cover lower structures (not illustrated), for example, a transistor, formed on a semiconductor substrate (not illustrated).

The first conductive layer 203 may be formed using a metal, for example, W, Cu, Al, Ti or Ta, which may be used alone or in a combination thereof.

The first preliminary semiconductor layer 103 may include, e.g., silicon-based or germanium-based semiconductor material. For example, the first preliminary semiconductor layer 103 may be formed using polysilicon.

In some embodiments, the first preliminary semiconductor layer 103 may be formed using a semiconductor material doped with a first impurity. For example, the first preliminary semiconductor layer 103 may be formed of polysilicon containing an n-type impurity such as arsenic or phosphorous.

The first conductive layer 203 and the first preliminary semiconductor layer 103 may be formed by, e.g., a physical vapor deposition (PVD) process, a sputtering process, an atomic layer deposition (ALD) process or a chemical vapor deposition (CVD) process, a plasma enhanced chemical vapor deposition (PECVD).

Figure 7:
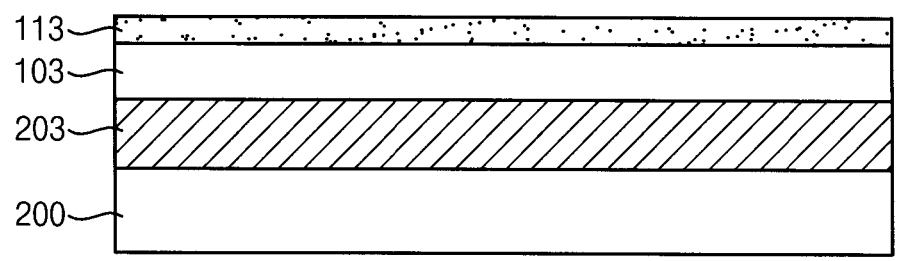

Referring to FIG. 7, a first preliminary diffusion barrier layer 113 may be formed on the first preliminary semiconductor layer 103.

In example embodiments, a dopant including carbon may be implanted or deposited on the first preliminary semiconductor layer 103 to form the first preliminary diffusion barrier layer 113.

In some embodiments, the first preliminary diffusion barrier layer 113 may be formed by implanting a carbon ion at an upper portion of the first preliminary semiconductor layer 103 through an ion-implantation process.

In some embodiments, the first preliminary diffusion barrier layer 113 may be formed by a selective epitaxial growth (SEG) process using a carbon-containing gas. For example, the carbon-containing gas may include, e.g., methyl silane ($SiH_3CH_3$), methane ($CH_4$) or ethane ($C_2H_6$). These may be used alone or in a combination thereof. The first preliminary semiconductor layer 103 may be used as a seed in the SEG process, and thus the first preliminary diffusion barrier layer 113 may include a carbon-doped silicon-based material such as silicon carbide.

In some embodiments, before performing the SEG process, a surface of the first preliminary semiconductor layer 103 may be cleaned using, e.g., a fluoric acid (HF) solution. A portion of the first impurity exposed on the surface of the first preliminary semiconductor layer 103 may be removed by the cleansing process. Accordingly, a diffusion of the first impurity into the first preliminary diffusion barrier layer 113 may be prevented or inhibited while performing the SEG process.

Figure 8:
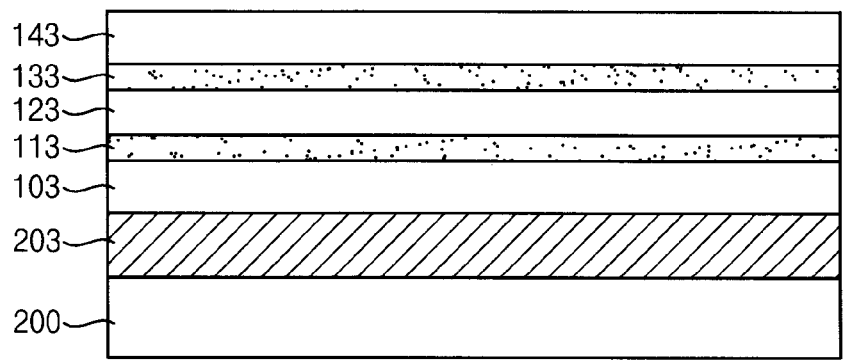

Referring to FIG. 8, a preliminary intrinsic semiconductor layer 123, a second preliminary diffusion barrier layer 133 and a second preliminary semiconductor layer 143 may be sequentially formed on the first preliminary diffusion barrier layer 113.

The preliminary intrinsic semiconductor layer 123 may be formed using a semiconductor material, e.g., polysilicon which is not doped with impurity.

The second preliminary diffusion barrier layer 133 may be formed by a process substantially the same as or similar to that for the first preliminary diffusion barrier layer 113 described above. Accordingly, the second preliminary diffusion barrier layer 133 may be formed of a carbon-doped silicon-based material, e.g., polysilicon doped with carbon or silicon carbide.

The second preliminary semiconductor layer 143 may include, e.g., silicon-based or germanium-based semiconductor material. For example, the second preliminary semiconductor layer 143 may be formed using polysilicon.

In some embodiments, the second preliminary semiconductor layer 143 may be formed using a semiconductor material doped with a second impurity. For example, the second preliminary semiconductor layer 143 may be formed of polysilicon containing a p-type impurity such as boron or indium.

The preliminary intrinsic semiconductor layer 123, the second preliminary diffusion barrier layer 133 and the second preliminary semiconductor layer 143 may be formed by a PVD process, a sputtering process, an ALD process or a CVD process.

In some embodiments, as illustrated in FIG. 2, the dopant including carbon may be distributed to form a plurality of dopant regions.

In example embodiments, the dopant regions may include a first dopant region formed at a region adjacent to an interface of the first preliminary semiconductor layer 103 and the preliminary intrinsic semiconductor layer 123, and a second dopant region formed at a region adjacent to an interface of the second preliminary semiconductor layer 143 and the preliminary intrinsic semiconductor layer 123.

Figure 9:
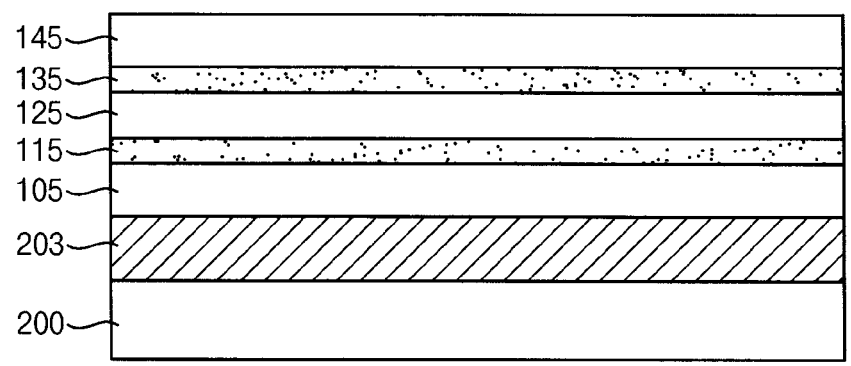

Referring to FIG. 9, an annealing process may be performed to transform the first preliminary semiconductor layer 103, the first preliminary diffusion barrier layer 113, the preliminary intrinsic semiconductor layer 123, the second preliminary diffusion barrier layer 133 and the second preliminary semiconductor layer 143 into a first semiconductor layer 105, a first diffusion barrier layer 115, an intrinsic semiconductor layer 125, a second diffusion barrier layer 135 and a second semiconductor layer 145, respectively.

In example embodiments, the first impurity and the second impurity contained in the preliminary semiconductor layer 103 and the second preliminary layer 143, respectively, may be uniformly diffused and distributed in the first semiconductor layer 105 and the second semiconductor layer 145, respectively, by the annealing process. While performing the annealing process, the first and second impurities may be blocked by the first and second diffusion barrier layers 115 and 135, respectively. Accordingly, the first and second impurities may not be mixed or adulterated in the intrinsic semiconductor layer 125.

In some embodiments, an ion-implantation process may be performed before the annealing process. For example, the first impurity may be implanted into the first preliminary semiconductor layer 103, and then the second impurity may be implanted into the second preliminary semiconductor layer 143. A projected range (Rp) of each of the first and second impurities may be controlled in the ion-implantation process, so that the first preliminary semiconductor layer 103 and the second preliminary semiconductor layer 143 may contain exclusively the first impurity and the second impurity, respectively.

However, as described above, the first and second impurities may be doped or implanted in each process for the formation of the first preliminary semiconductor layer 103 and the second preliminary semiconductor layer 143.

Figure 10:
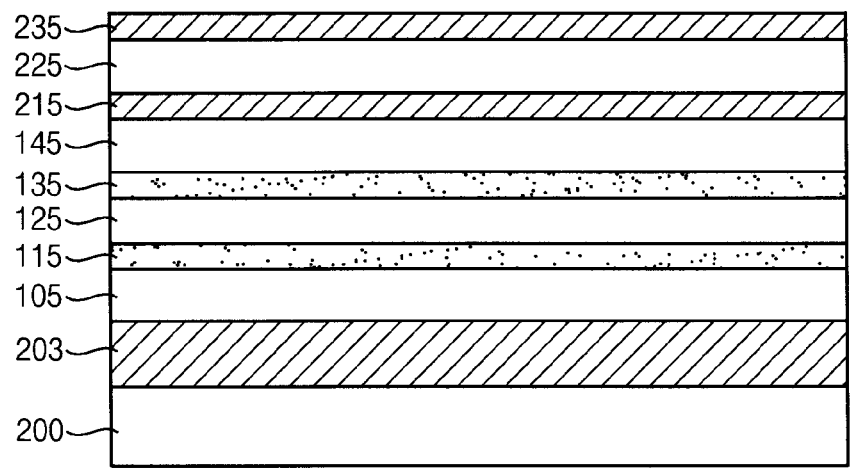

Referring to FIG. 10, a lower electrode layer 215, a variable resistance material layer 225 and an upper electrode layer 235 may be sequentially formed on the second semiconductor layer 145.

The lower electrode layer 215 and the upper electrode layer 235 may be formed of a metal nitride or a metal silicon nitride. For example, the lower electrode layer 215 and the upper electrode layer 235 may be formed of titanium nitride, titanium silicon nitride, tungsten nitride, tungsten silicon nitride, tantalum nitride, tantalum silicon nitride, zirconium nitride or zirconium silicon nitride. These may be used alone or in a combination thereof.

A material for the variable resistance material layer 225 may be selected in consideration of types of the variable resistance memory device. In example embodiments, if the variable resistance memory device is implemented to a ReRAM device, the variable resistance material layer 225 may be formed using a perovskite-based material or a transition metal oxide. For example, the variable resistance material layer 225 may be formed of STO, BTO, PCMO, titanium oxide, zirconium oxide, aluminum oxide, hafnium oxide, tantalum oxide, niobium oxide, cobalt oxide, tungsten oxide, lanthanum oxide, zinc oxide or a combination thereof. The variable resistance material layer 225 may be formed as a multi-layered structure including a plurality of the above materials.

In some embodiments, if the variable resistance memory device is implemented to a PRAM device, the variable resistance material layer 225 may be formed using a chalcogenide-based material. In some embodiments, if the variable resistance memory device is implemented to an MRAM device, the variable resistance material layer 225 may be formed using a ferromagnetic material, for example, Fe, Ni, Co, Dy or Gd.

The lower electrode layer 215, the variable resistance material layer 225 and the upper electrode layer 235 may be formed by, e.g., a PVD process, an ALD process or a CVD process.

Figure 11:
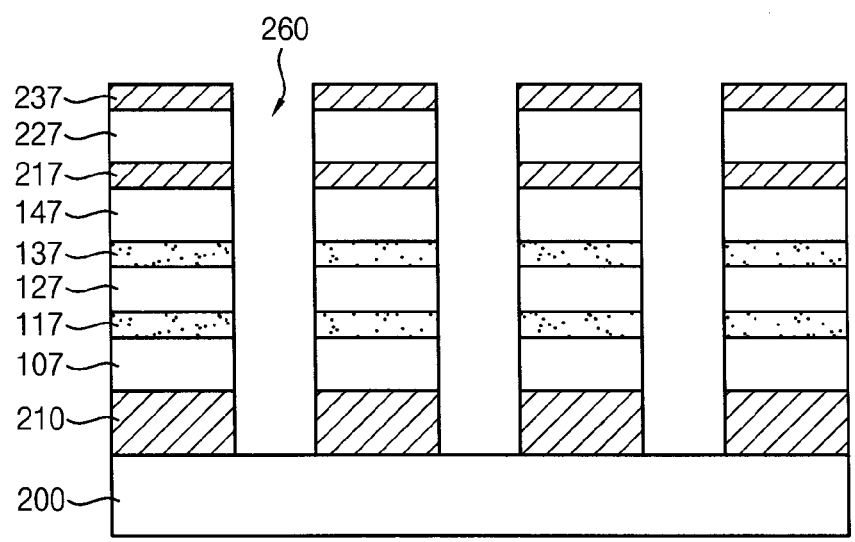

Referring to FIG. 11, the upper electrode layer 235, the variable resistance material layer 225, the lower electrode layer 215, the second semiconductor layer 145, the second diffusion barrier layer 135, the intrinsic semiconductor layer 125, the first diffusion barrier layer 115, the first semiconductor layer 105 and the first conductive layer 203 may be partially etched to form a first opening 260.

For example, a mask pattern (not illustrated) extending in the first direction may be formed on the upper electrode 235. The upper electrode layer 235, the variable resistance material layer 225, the lower electrode layer 215, the second semiconductor layer 145, the second diffusion barrier layer 135, the intrinsic semiconductor layer 125, the first diffusion barrier layer 115, the first semiconductor layer 105 and the first conductive layer 203 may be sequentially etched by a dry etching process using the mask pattern as an etching mask to form the first opening 260. The mask pattern may include a photoresist material, or carbon-based or silicon-based spin-on hard mask (SOH) material. The mask pattern may be removed by an ashing process and/or a strip process after the formation of the first opening 260.

In some embodiments, an upper portion of the base insulation layer 200 may be also partially removed during the etching process for the formation of the first opening 260. In this case, the first opening 260 may extend through the upper portion of the base insulation layer 200.

In example embodiments, the first opening 260 may extend in the first direction, and a plurality of the first openings 260 may be formed along the second direction. By the formation of the first opening 260, a first conductive line 210, a first semiconductor layer line 107, a first diffusion barrier layer line 117, an intrinsic semiconductor layer line 127, a second diffusion barrier layer line 137, a second semiconductor layer line 147, a lower electrode layer pattern 217, a variable resistance material layer pattern 227 and an upper electrode layer pattern 237 sequentially stacked on the base insulation layer 200 may be obtained.

Figure 12:
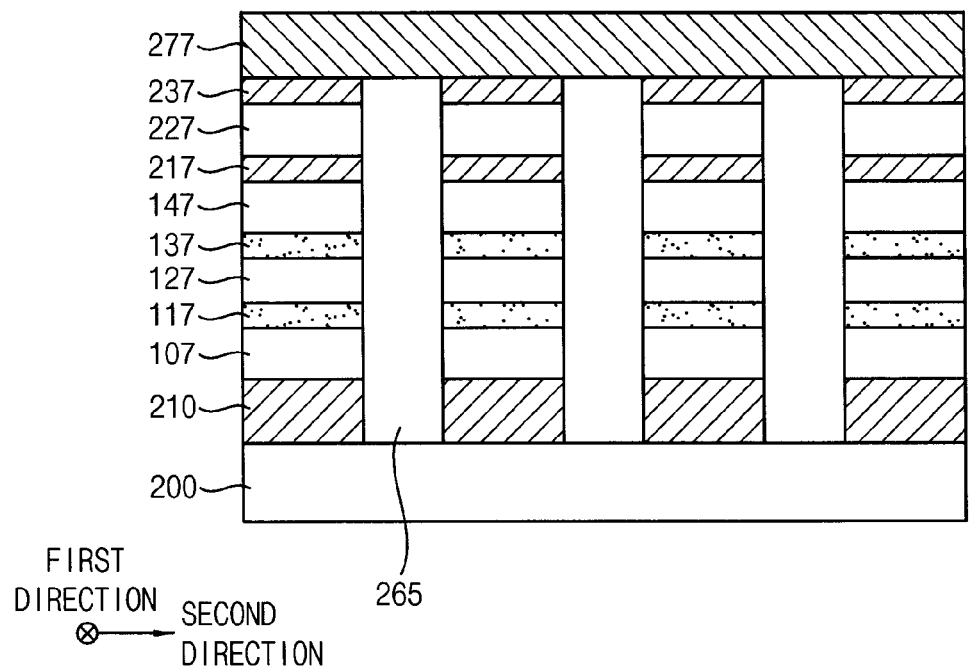

Referring to FIG. 12, a first insulation layer pattern 265 filling the first opening 260 may be formed, and a second conductive layer 277 may be formed on the upper electrode layer pattern 237 and the first insulation layer pattern 265.

In example embodiments, a first insulation layer sufficiently filling the first opening 260 may be formed on the base insulation layer 200 and the upper electrode layer pattern 237. An upper portion of the first insulation layer may be planarized until a top surface of the upper electrode layer pattern 237 is exposed to form the first insulation layer pattern 265.

The first insulation layer may be formed of a silicon oxide-based material that may have improved gap-fill property or step coverage such as an MTO, an HTO or an ALD oxide. The planarization process may include a chemical mechanical polish (CMP) process or an etch-back process.

The second conductive layer 277 may be formed using a material substantially the same as or similar to that for the first conductive layer 203. For example, the second conductive layer 277 may be formed using a metal by a sputtering process or an ALD process.

Referring to FIG. 13, the second conductive layer 277, the upper electrode layer pattern 237, the variable resistance material layer pattern 227, the lower electrode layer pattern 217, the second semiconductor layer line 147, the second diffusion barrier layer line 137, the intrinsic semiconductor layer line 127, the first diffusion barrier layer line 117 and the first semiconductor layer line 107 may be partially etched to form a second opening 270. The first insulation layer pattern 265 may be also partially etched during the etching process.

For example, a mask pattern (not illustrated) extending in the second direction may be formed on the second conductive layer 277. The second conductive layer 277, the upper electrode layer pattern 237, the variable resistance material layer pattern 227, the lower electrode layer pattern 217, the second semiconductor layer line 147, the second diffusion barrier layer line 137, the intrinsic semiconductor layer line 127, the first diffusion barrier layer line 117 and the first semiconductor layer line 107 may be sequentially etched together with the first insulation layer pattern 265 by a dry etching process using the mask pattern as an etching mask to form the second opening 270. The mask pattern may include a photoresist material, or carbon-based or silicon-based spin-on hard mask SOH material. The mask pattern may be removed by an ashing process and/or a strip process after the formation of the first opening 270.

In example embodiments, the second opening 270 may extend in the second direction, and a plurality of the second openings 270 may be formed along the first direction. A top surface of the first conductive line 210 may be exposed through the second opening 270.

In some embodiments, an upper portion of the first conductive line 210 may be also partially removed during the etching process for the formation of the second opening 270. In this case, the second opening 270 may extend through the upper portion of the first conductive line 210.

By the formation of the second opening 270, a second conductive line 280 may be obtained. A first semiconductor pattern 110, a first diffusion barrier pattern 120, an intrinsic semiconductor pattern 130, a second diffusion barrier pattern 140, a second semiconductor pattern 150, a lower electrode 220, a variable resistance pattern 230 and an upper electrode 240 may be formed sequentially between the first conductive line 210 and the second conductive line 280.

The second conductive line 280 may extend in the second direction, and a plurality of the second conductive lines 280 may be formed along the first direction. Accordingly, the second conductive line 280 may extend over the first conductive line 210 to cross the first conductive line 210. As illustrated in FIG. 3, a memory cell 255 may be formed at each intersection region 205 of the first and second conductive lines 210 and 280.

The memory cell 255 may include a selection device 100 and a resistance device 250. The selection device 100 may include the first semiconductor pattern 110, the first diffusion barrier pattern 120, the intrinsic semiconductor pattern 130, the second diffusion barrier pattern 140 and the second semiconductor pattern 150 sequentially stacked on the first conductive line 210. The resistance device 250 may include the lower electrode 220, the variable resistance pattern 230 and the upper electrode 240 formed on the selection device 100.

In some embodiments, as illustrated with reference to FIG. 2, a dopant including carbon may be distributed in the selection device 100 to include a plurality of dopant regions. In some example embodiments, a first dopant region and a second dopant region corresponding to maximum concentration peaks may be formed in the selection device 100.

The first dopant region may be formed at a region adjacent to an interface of the first semiconductor pattern 110 and the intrinsic semiconductor pattern 130. In an example embodiment, the first dopant region may be formed throughout an upper portion of the first semiconductor pattern 110 and a lower portion of the intrinsic semiconductor pattern 130.

The second dopant region may be formed at a region adjacent to an interface of the second semiconductor pattern 150 and the intrinsic semiconductor pattern 130. In an example embodiment, the second dopant region may be formed throughout a lower portion of the second semiconductor pattern 150 and an upper portion of the intrinsic semiconductor pattern 130.

Referring to FIG. 14, a second insulation layer pattern 275 filling the second opening 270 may be formed.

In example embodiments, a second insulation layer sufficiently filling the second opening 270 may be formed on the first conductive line 210, the first insulation layer pattern 265 and the second conductive line 280. The second insulation layer may be formed of a silicon oxide-based material substantially the same as or similar to that for the first insulation layer.

An upper portion of the second insulation layer may be planarized by, e.g., a CMP process until a top surface of the second conductive line 280 is exposed to form the second insulation layer pattern 275.

The second insulation layer pattern 275 may extend in the second direction, and a plurality of the second insulation layer patterns 275 may be formed along the first direction. The first and second insulation layer patterns 265 and 275 may cross and meet each other.

A lateral portion of the memory cell 255 at each intersection region 205 may be surrounded by the first and second insulation layer patterns 265 and 275. Thus, the memory cells 255 neighboring each other may be insulated by the first and second insulation layer patterns 265 and 275.

In some embodiments, processes substantially the same as or similar to those described above may be repeated to form additional memory cells and conductive lines on the second conductive line 280 and the second insulation layer pattern 275. In this case, a variable resistance memory device including a stack-type memory cell array may be obtained.

Figure 15:
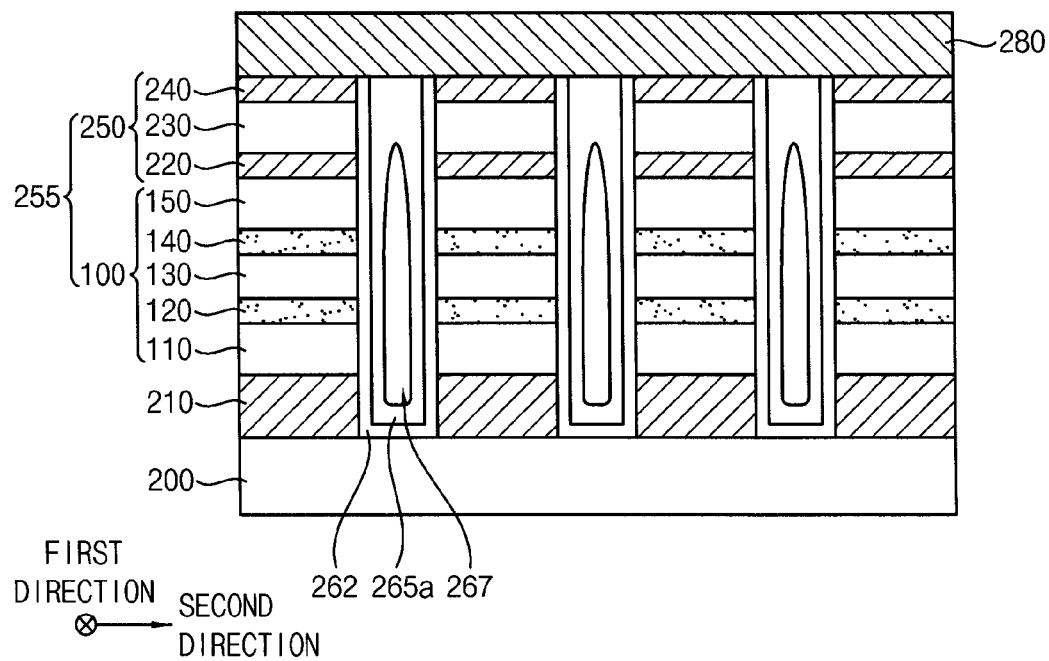
Figure 16:
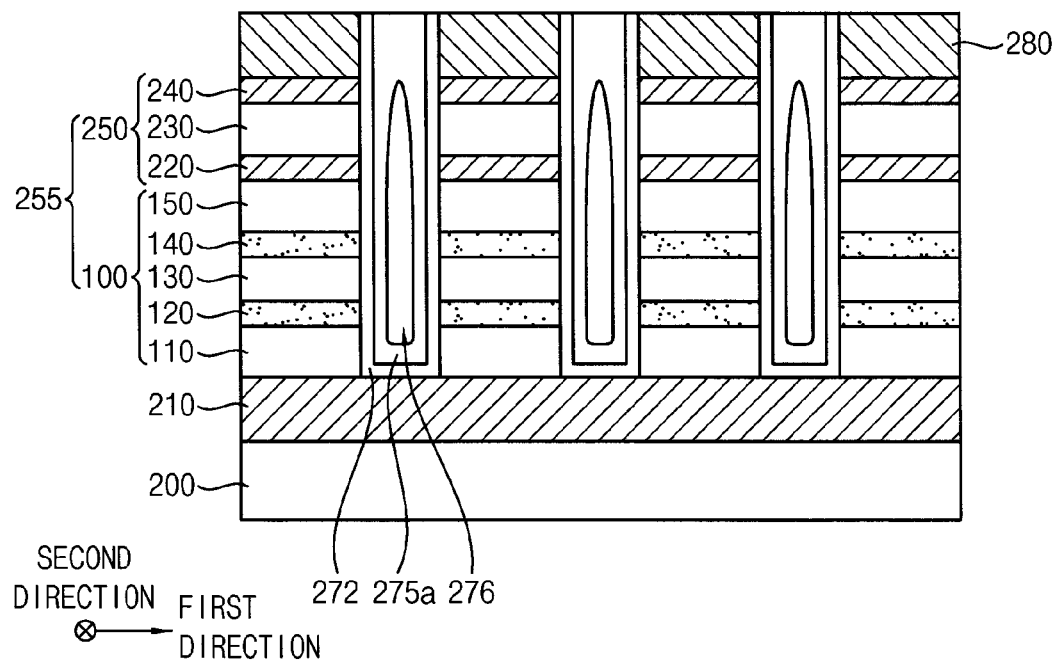

FIGS. 15 and 16 are cross-sectional views illustrating a variable resistance memory device in accordance with example embodiments.

The variable resistance memory device of FIGS. 15 and 16 may have elements and/or constructions substantially the same as or similar to those of the variable resistance memory device illustrated with reference to FIGS. 3 to 5 except for an addition of a spacer and an air gap. Thus, detailed descriptions on repeated elements and/or structures are omitted herein, and like reference numerals are used to designate like elements.

Referring to FIGS. 15 and 16, the variable resistance memory device may include a memory cell 255 disposed at each intersection region of a first conductive line 210 and a second conductive line 280 extending in the first direction and the second direction, respectively.

A plurality of the memory cells 255 may be arranged along the first direction to define a memory cell column. A plurality of the memory cell columns may be arranged along the second direction. A plurality of the memory cells 255 may be arranged along the second direction to define a memory cell row. A plurality of the memory cell rows may be arranged along the first direction.

A first spacer 262 may be formed on sidewalls of the memory cell 255 and the first conductive line 210. The first spacer 262 may be also formed on a top surface of a base insulation layer 200 exposed between the neighboring first conductive lines 210. For example, the first spacer 262 may be formed on sidewalls of the memory cells 255 facing and neighboring in the second direction.

A second spacer 272 may be formed on sidewalls of the memory cell 255 and the second conductive line 280. The second spacer 272 may be also formed on a top surface of the first conductive line 210 exposed between neighboring first semiconductor patterns 110. For example, the second spacer 272 may be formed on sidewalls of the memory cells 255 facing and neighboring in the first direction.

Accordingly, the sidewall of each memory cell 255 may be surrounded by the first and second spacers 262 and 272.

In example embodiments, the first and second spacers 262 and 272 may include a carbon-containing insulation material. For example, the first and second spacers 262 and 272 may include silicon carbonitride (SiCxNy) or silicon carbooxide. Accordingly, impurities included in first and second semiconductor patterns 110 and 150 may be prevented or inhibited from being diffused through the sidewall of the memory cell 255.

A first insulation layer pattern 265a may be formed on the first spacer 262, and may extend in the first direction and between the neighboring memory cell columns. In some embodiments, a first air gap 267 may be formed in the first insulation layer pattern 265a. The first air gap 267 may extend in the first direction and between the neighboring memory cell columns.

The first conductive lines 210 and the memory cell columns may be separated or insulated from each other by the first insulation layer pattern 265a and the first air gap 267.

A second insulation layer pattern 275a may be formed on the second spacer 272, and may extend in the second direction and between the neighboring memory cell rows. In some embodiments, a second air gap 276 may be formed in the second insulation layer pattern 275a. The second air gap 276 may extend in the second direction and between the neighboring memory cell rows.

The second conductive lines 280 and the memory cell rows may be separated or insulated from each other by the second insulation layer pattern 275a and the second air gap 276.

The first and second insulation layer patterns 265a and 275a may cross and meet each other, and may be integrally connected or merged with each other. The first and second air gaps 267 and 276 may cross each other, and may be in fluid communication with each other.

The first and second insulation layer patterns 265a and 275a may include an insulation material having undesirable gap-fill property or step coverage. For example, the first and second insulation layer patterns 265a and 275a may include a silicon oxide-based material such as tetra ethyl ortho silicate (TEOS) or a CVD oxide.

According to example embodiments described above, the impurities included in the first and second semiconductor patterns 110 and 150 may be further prevented or inhibited by the air gaps 267 and 276 from being diffused through the sidewall of the memory cell 255.

FIGS. 17 to 22 are cross-sectional views illustrating a method of manufacturing a variable resistance memory device in accordance with example embodiments. For example, FIGS. 17 to 22 illustrate a method of manufacturing the variable resistance memory device of FIGS. 15 and 16.

Figure 17:
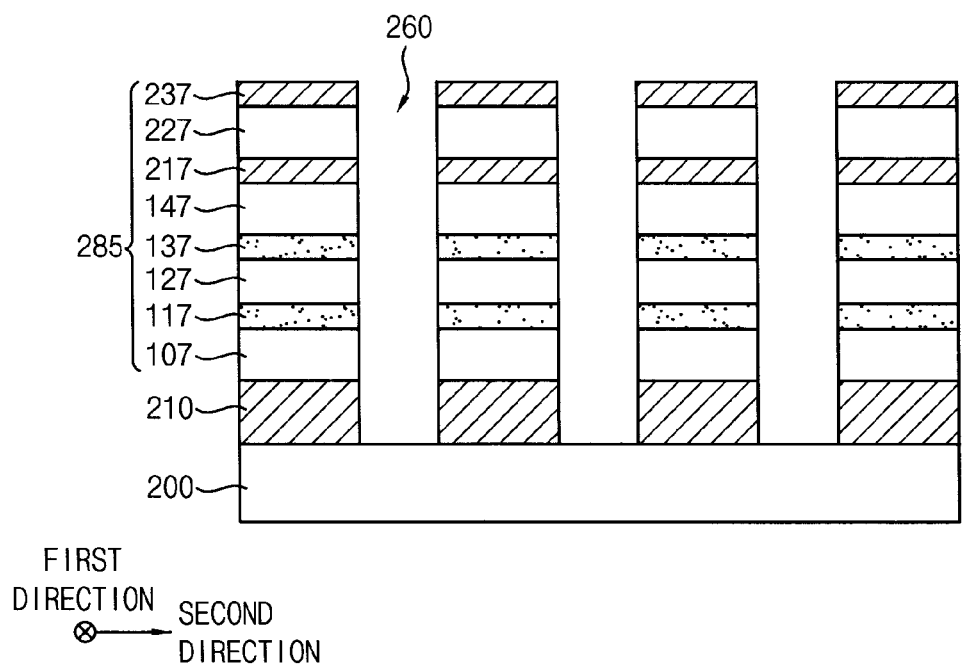
Figure 18:
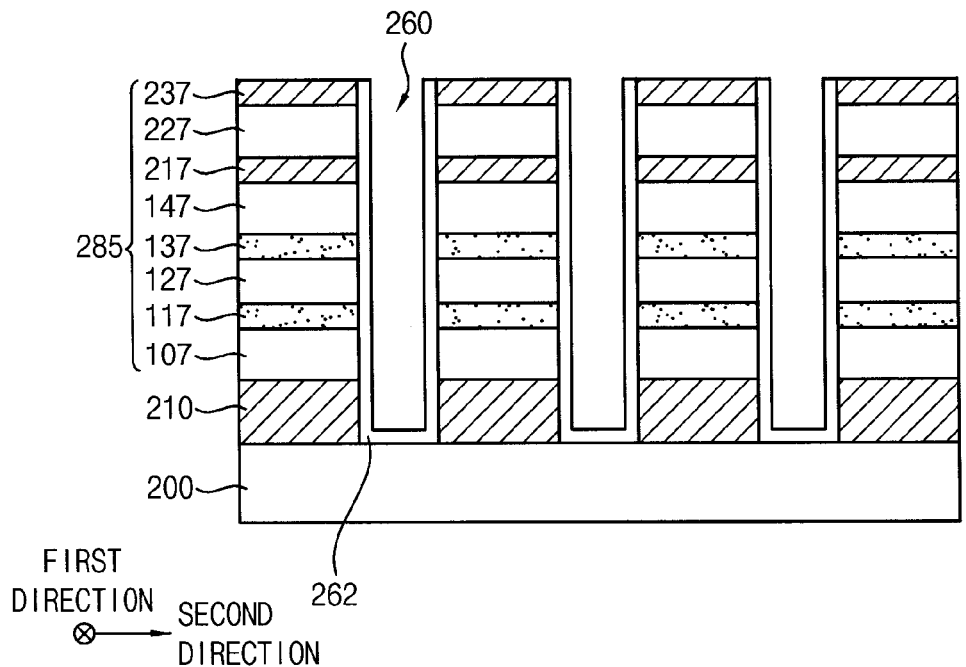
Figure 19:
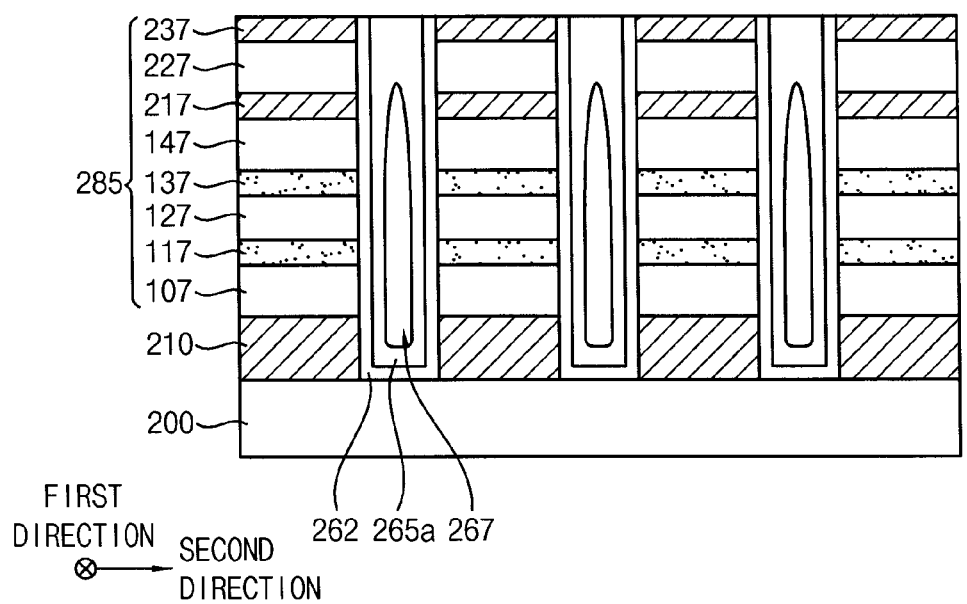
Figure 20:
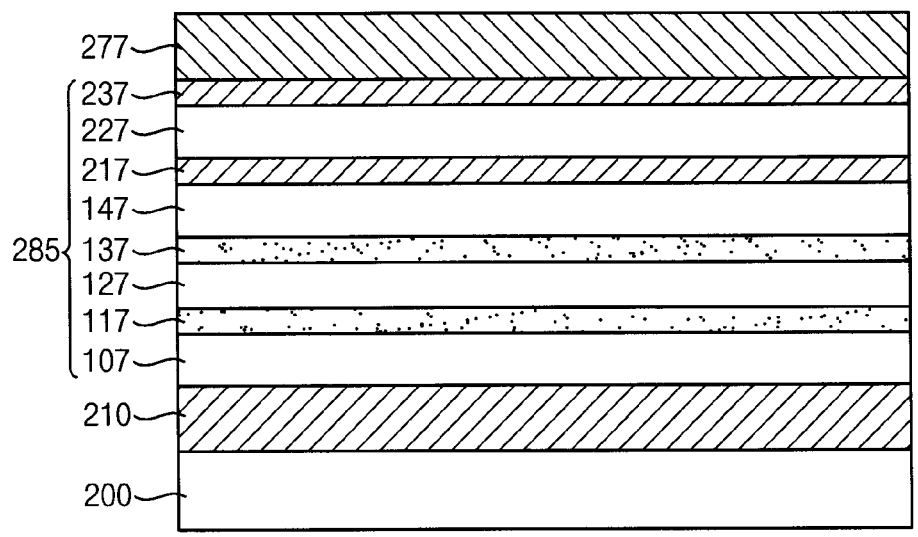
Figure 21:
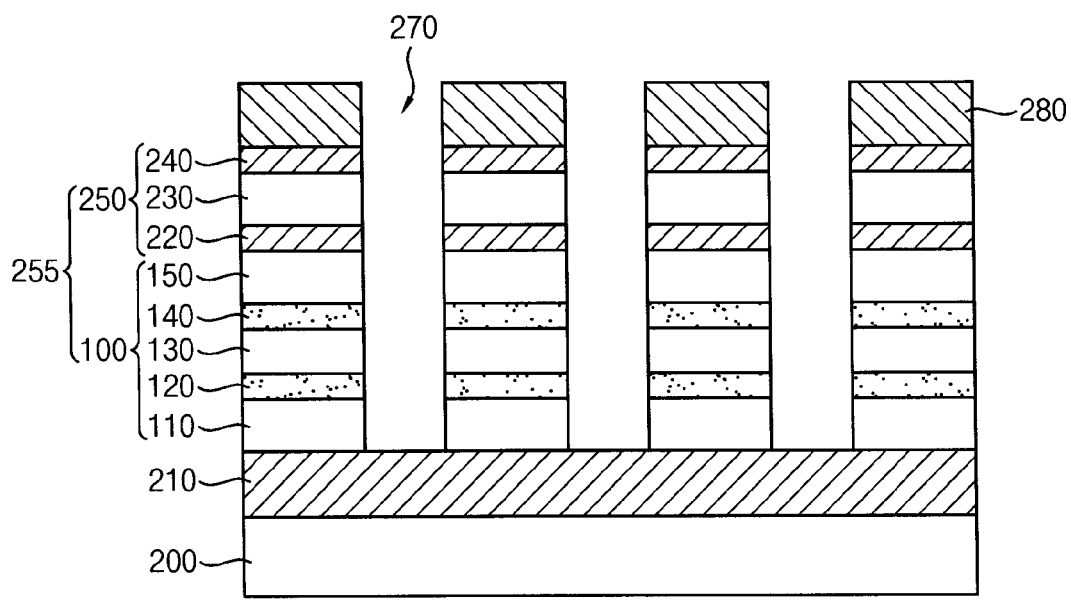
Figure 22:
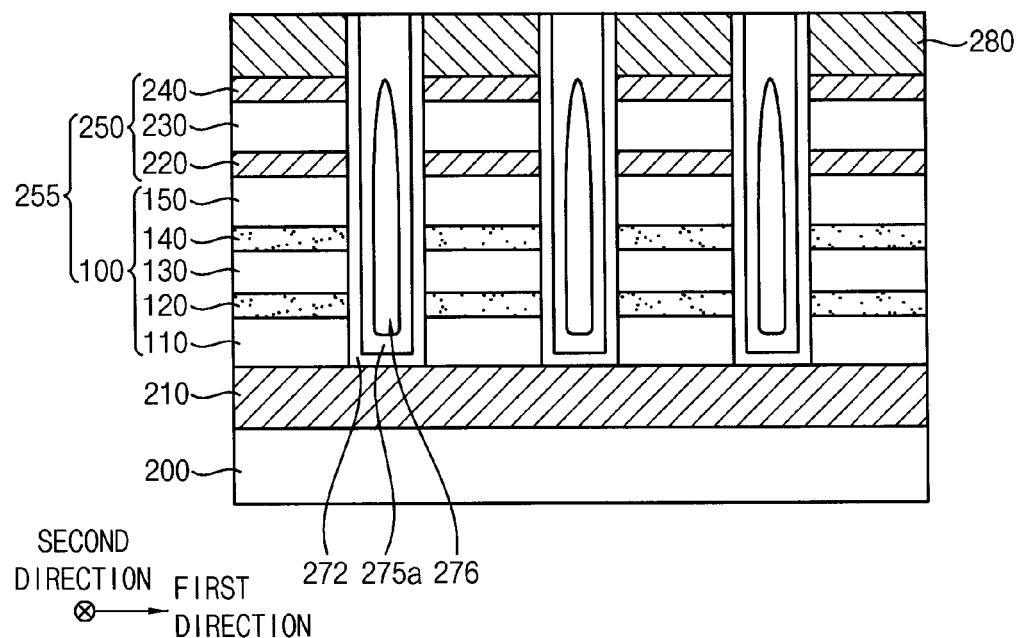

Specifically, FIGS. 17 to 19 are cross-sectional views taken along a line I-I' indicated in FIG. 3. FIGS. 20 to 22 are cross-sectional views taken along a line II-II' indicated in FIG. 3.

Detailed descriptions on processes and/or materials substantially the same as or similar to those illustrated with reference to FIGS. 6 to 14 are omitted herein.

Referring to FIG. 17, processes substantially the same as or similar to those illustrated with reference to FIGS. 6 to 11 may be performed.

Accordingly, a first conductive layer, a first semiconductor layer, a first diffusion barrier layer, an intrinsic semiconductor layer, a second diffusion barrier layer, a second semiconductor layer, a lower electrode layer, a variable resistance material layer and an upper electrode layer may be sequentially formed on a base insulation layer 200, and then may be etched to form a first opening 260 extending in the first direction.

By the formation of the first opening 260, a first conductive line 210 extending in the first direction may be formed on the base insulation layer 200. A memory cell line structure 285 including a first semiconductor layer line 107, a first diffusion barrier layer line 117, an intrinsic semiconductor layer line 127, a second diffusion barrier layer line 137, a second semiconductor layer line 147, a lower electrode layer pattern 217, a variable resistance material layer pattern 227 and an upper electrode layer pattern 237 may be formed on the first conductive line 210.

Referring to FIG. 18, a first spacer 262 may be formed on sidewalls of the memory cell line structure 285 and the first conductive line 210, and on a top surface of the base insulation layer 200 exposed through the first opening 260.

In example embodiments, a first spacer layer may be formed along top surfaces and the sidewalls of the memory cell line structures, the sidewalls of the first conductive lines 210, and the top surface of the base insulation layer 200. The first spacer layer may be formed of a carbon-containing insulation material such as silicon carbonitride or silicon carbooxide by, e.g., a sputtering process or an ALD process.

Subsequently, an upper portion of the first spacer layer may be planarized by, e.g., an etch-back process or a CMP process until a top surface of the upper electrode layer pattern 237 is exposed to form the first spacer 262.

In example embodiments, an impurity diffusion from sidewalls of the first semiconductor layer line 107 and the second semiconductor layer line 147 may be blocked by the first spacer 262 while performing, e.g., a subsequent deposition process at a high temperature.

In an example embodiment, before the formation of the first spacer 262, the sidewall of the memory cell line structure 285 may be cleaned using an acid solution, e.g., a fluoric acid solution. Thus, a portion of impurities that may be diffused and mixed through sidewalls of the first semiconductor layer line 107, the first diffusion barrier layer line 117, the intrinsic semiconductor layer line 127, the second diffusion barrier layer line 137 and the second semiconductor layer line 147 may be removed.

Referring to FIG. 19, a first insulation layer pattern 265a may be formed on the first spacer 262.

In example embodiments, a first insulation layer sufficiently filling the first opening 260 may be formed on the first spacer 262 and the top surface of the upper electrode layer pattern 237. The first insulation layer may be formed using a material and a process condition that may have undesirable gap-fill property and step coverage. For example, the first insulation layer may be formed of, e.g., TEOS or a CVD oxide by a CVD process or a spin coating process.

An upper portion of the first insulation layer may be planarized by, e.g., a CMP process or an etch-back process until the top surface of the upper electrode layer pattern 237 is exposed to form the first insulation layer pattern 265a.

In some embodiments, a first air gap 267 may be formed in the first insulation layer pattern 265a. For example, an upper portion of the first opening 260 may be capped or closed by the first insulation layer pattern 265a. The first air gap 267 may be formed between the first semiconductor lines 107, the first diffusion barrier layer lines 117, the intrinsic semiconductor layer lines 127, the second diffusion barrier layer lines 137 and the second semiconductor layer lines 147 included in the neighboring memory cell line structures 285.

Referring to FIG. 20, a second conductive layer 277 may be formed on the upper electrode layer pattern 237, the first spacer 262 and the first insulation layer pattern 265a.

Referring to FIG. 21, a process substantially the same as or similar to that illustrated with reference to FIG. 13 may be performed.

Accordingly, the second conductive layer 277 and the memory line cell structures 285 may be partially etched to form a second opening 270. The first insulation layer pattern 265 may be also partially removed during the etching process.

The second opening 270 may extend in the second direction, and a plurality of the second openings 270 may be formed along the first direction. A top surface of the first conductive line 210 may be exposed through the second opening 270.

By the formation of the second opening 270, a second conductive line 280 may be formed. A memory cell 255 including a first semiconductor pattern 110, a first diffusion barrier pattern 120, an intrinsic semiconductor pattern 130, a second diffusion barrier pattern 140, a second semiconductor pattern 150, a lower electrode 220, a variable resistance pattern 230 and an upper electrode 240 may be formed between the first and second conductive lines 210 and 280.

Referring to FIG. 22, a second spacer 272 may be formed on sidewalls of the second conductive line 280 and the memory cell 255, and the top surface of the first conductive line. The second spacer 272 may be also formed on a portion of a surface of the first insulation layer pattern 275a.

The second spacer 272 may be formed using a material and a process substantially the same as or similar to those for the formation of the first spacer 262.

In some embodiments, before the formation of the second spacer 272, the sidewall of the memory cell 255 may be cleaned using, e.g., a fluoric acid solution. Accordingly, impurities that may be diffused and mixed through sidewalls of the first semiconductor pattern 110, the first diffusion barrier pattern 120, the intrinsic semiconductor pattern 130, the second diffusion barrier pattern 140 and the second semiconductor pattern 150 may be removed.

A second insulation layer pattern 275a filling the second opening 270 may be formed on the second spacer 272. The second insulation layer pattern 275a may be formed using a material and a process substantially the same as or similar to those for the formation of the first insulation layer pattern 265a.

A second air gap 276 may be formed in the second insulation layer pattern 275a. For example, an upper portion of the second opening 270 may be capped or closed by the second insulation layer pattern 275a. The second air gap 276 may be formed between the first semiconductor patterns 110, the first diffusion barrier patterns 120, the intrinsic semiconductor patterns 130, the second diffusion barrier patterns 140 and the second semiconductor patterns 150 included in the neighboring memory cells 255.

The second spacer 272 and the first spacer 262 may cross each other, and may be connected or merged with each other. Accordingly, a lateral portion of the memory cell 255 may be surrounded by the first and second spacers 262 and 272. The first and second insulation layer patterns 265a and 275a may also cross each other, and may be connected or merged with each other.

In some embodiments, the first and second air gaps 267 and 276 may extend to cross each other, and may be in fluid communication with each other.

According to example embodiments as described above, the first and second spacers 262 and 272 containing, e.g., carbon may be formed on the sidewall of the memory cell 255 so that a diffusion of the impurity included in the selection device 100 may be additionally prevented or inhibited. Additionally, widths of the first and second openings 260 and 270 may be reduced by the first and second spacers 262 and 272. Thus, the first and second insulation layer patterns 265a and 275a may be overhung at the upper portions of the first and second openings 260 and 270 such that the air gaps 267 and 276 may be formed. An interference or a parasitic capacitance generated between the neighboring memory cells 255 may be suppressed by the air gaps 267 and 276.

Figure 23:
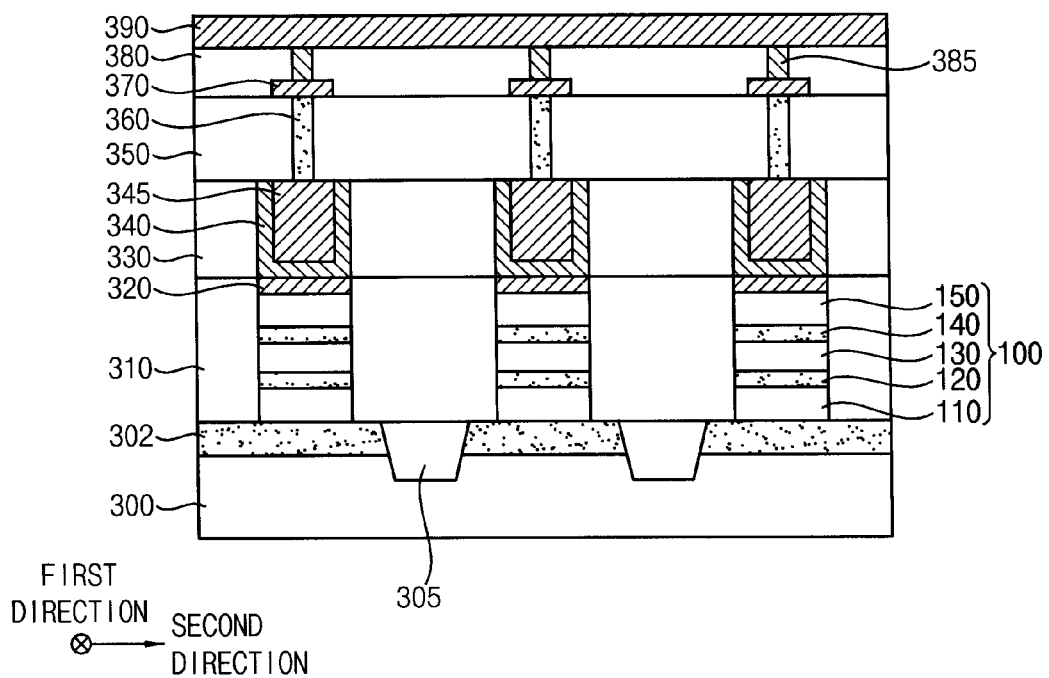

FIG. 23 is a cross-sectional view illustrating a variable resistance memory device in accordance with example embodiments. For example, FIG. 23 illustrates a non-volatile phase change memory (PRAM) device.

Referring to FIG. 23, the variable resistance memory device may include a semiconductor diode 100 formed on a substrate 300, and may further include a lower electrode 345, a phase change material pattern 360 and an upper electrode 370. The semiconductor diode 100 and the upper electrode 370 may be electrically connected to a first conductive line 302 and a second conductive line 390, respectively.

The first conductive line 302 may be formed at an upper portion of the substrate.

The substrate may be a semiconductor substrate such as a silicon substrate, a germanium substrate, a silicon-germanium substrate, a silicon on insulator (SOI) substrate, a germanium on insulator (GOI) substrate or the like. The substrate 300 may include a cell region on which memory cells are formed, and a peripheral circuit region on which peripheral circuit device applying a driving signal to the memory cells are formed. FIG. 23 only illustrates the cell region for convenience of descriptions.

The substrate 300 may be divided into an active region and a field region by an isolation layer pattern 305. The isolation layer pattern 305 may extend in a first direction substantially parallel to a top surface of the substrate 300. A plurality of the isolation layer patterns 305 may be formed along a second direction substantially parallel to the top surface of the substrate 300 and perpendicular to the first direction. The first conductive lines 302 may be physically separated from each other by the isolation layer pattern 305.

The isolation layer pattern 305 may include an insulation material, e.g., silicon oxide.

The first conductive line 302 may be formed at an upper portion of each active region of the substrate 300. Thus, the first conductive line 302 may extend in the first direction, and a plurality of the first conductive lines 302 may be formed along the second direction. The first conductive line 302 may include n-type impurities such as P or As. In example embodiments, the first conductive line 302 may serve as a word line of the variable resistance memory device.

The semiconductor diode 100 may extend through a first insulating interlayer 310 and may be disposed on the first conductive line 302. The semiconductor diode 100 may have a cylindrical shape or a polygonal column shape.

A plurality of the semiconductor diodes 100 may be arranged in the first direction on the first conductive line 302. Accordingly, the semiconductor diodes 100 may be arranged along the first and second directions to form an array.

The semiconductor diode 100 may have a construction substantially the same as or similar to that illustrated with reference to FIG. 1. Accordingly, the semiconductor diode 100 may include a first semiconductor pattern 110, a first diffusion barrier pattern 120, an intrinsic semiconductor pattern 130, a second diffusion barrier pattern 140 and a second semiconductor pattern 150 sequentially stacked on the first conductive line 302.

As described above, the first semiconductor pattern 110 and the second semiconductor pattern 150 may include polysilicon doped with an n-type impurity and a p-type impurity, respectively. The first and second diffusion barrier patterns 120 and 140 may include polysilicon containing carbon as a dopant, or silicon carbide.

In some embodiments, as illustrated with reference to FIG. 2, a plurality of dopant regions may be formed along a height direction of the semiconductor diode 100. A concentration distribution of the dopant regions may form and correspond with a plurality of peaks.

For example, the first dopant region may be formed at a region adjacent to an interface of the first semiconductor pattern 110 and the intrinsic semiconductor pattern 130, and the second dopant region may be formed at a region adjacent to an interface of the second semiconductor pattern 150 and the intrinsic semiconductor pattern 130.

In some embodiments, an ohmic pattern 320 may be formed on the semiconductor diode 100. A contact resistance between the lower electrode 345 and the semiconductor diode 100 may be reduced by the ohmic pattern 320.

The ohmic pattern 320 may include a metal silicide, e.g., cobalt silicide, nickel silicide or tungsten silicide. The ohmic pattern 320 may have a shape substantially the same as or similar to that of the semiconductor diode 100. For example, the ohmic pattern 320 may have a cylindrical shape or a polygonal column shape.

The lower electrode 345 may extend through a second insulating interlayer 330 formed on the first insulating interlayer 310 to be electrically connected to the semiconductor diode 100. In some embodiments, a barrier conductive layer pattern 340 may surround a sidewall and a bottom of the lower electrode 345. For example, the barrier conductive layer pattern 340 may have a cup shape, and the lower electrode 345 may have a pillar shape accommodated in the barrier conductive layer pattern 340.

In example embodiments, the lower electrode 345 may serve as a heater electrode which may transform a current from the semiconductor diode 100 into a joule heat.

The barrier conductive layer pattern 340 may include a metal or a metal nitride such as titanium, titanium nitride, tantalum, tantalum nitride, or the like. The lower electrode 345 may include a metal having a low resistance such as copper, tungsten or aluminum.

A third insulating interlayer 350 may be formed on the second insulating interlayer 330 to cover the lower electrode 345. The phase change material pattern 360 may extend through the third insulating interlayer 350 to contact the lower electrode 345.

The phase change material pattern 360 may include a chalcogenide-based material, e.g., GeSbSe, SbSe, GeSbTe, SbTe, GeSb, AsSbTe, SnSbTe or SnInSbTe.

In example embodiments, the phase change material pattern 360 may have a width or a cross-section smaller than that of the lower electrode 345. Accordingly, a contact area between the phase change material pattern 360 and the lower electrode 345 may be reduced so that an efficiency of a heat transfer to the phase change material pattern 360 may be improved.

The upper electrode 370 may be disposed on the third insulating interlayer 350 to be in contact with the phase change material pattern 360. The upper electrode 370 may include a metal such as titanium, tantalum or tungsten, or a nitride thereof.

The lower electrode 345, the phase change material pattern 360 and the lower electrode 370 may be provided per each semiconductor diode 100. Accordingly, a memory cell including the semiconductor diode 100, the lower electrode 345, the phase change material pattern 360 and the upper electrode 370 may be defined.

A plurality of the memory cells may be arranged on the first conductive line 302 along the first direction to form a memory cell column. A plurality of the memory cell columns may be arranged along the second direction to form a memory cell array.

A fourth insulating interlayer 380 may be formed on the third insulating interlayer 350 to cover the lower electrode 370. A plurality of contacts 385 may extend through the fourth insulating interlayer 380 to be electrically connected to the upper electrodes 370. A second conductive line 390 may be disposed on the fourth insulating interlayer 380 to be electrically connected to the contacts 385. The second conductive line 390 may serve as a bit line of the variable resistance memory device.

In example embodiments, the second conductive line 390 may extend in the second direction, and a plurality of the second conductive lines 390 may be formed along the first direction.

The second conductive line 390 may be formed per each contact row including the contacts 385 arranged along the second direction. Thus, the first and second conductive lines 302 and 390 may cross each other. Each of the memory cells may be disposed at an intersection region of the first conductive line 302 and the second conductive line 390 such that a cross-point memory cell array may be defined.

The contact 385 and the second conductive line 390 may include a metal, e.g., copper, aluminum, tungsten, etc.

The first to fourth insulating interlayers 310, 330, 350 and 380 may include an insulation material such as silicon oxide. For example, the first to fourth insulating interlayers 310, 330, 350 and 380 may include plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like. In an example embodiment, at least two layers of the first to fourth insulating interlayers 310, 330, 350 and 370 may be merged with each other.

FIGS. 24 to 31 are cross-sectional views illustrating a method of manufacturing a variable resistance memory device in accordance with example embodiments. For example, FIGS. 24 to 31 illustrate a method of manufacturing the variable resistance memory device of FIG. 23.

Figure 24:
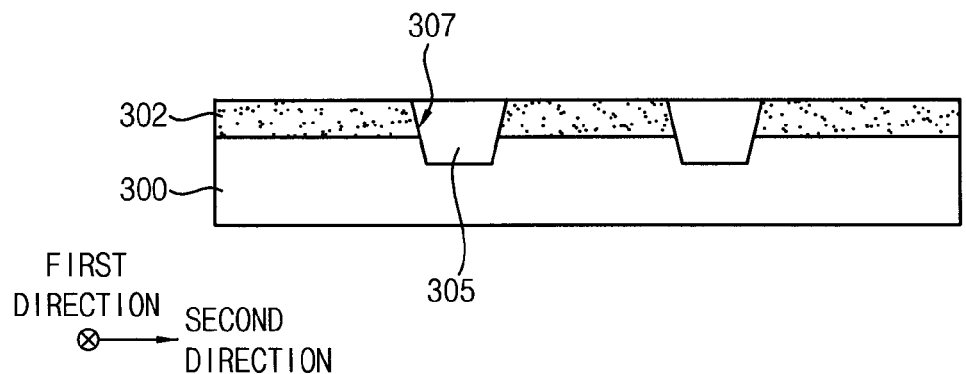

Referring to FIG. 24, impurities may be implanted at an upper portion of a substrate 300 to form an impurity region, and then an isolation layer pattern 305 may be formed such that the substrate 300 may be divided into an active region and a field region. The impurity region may be separated into a plurality of first conductive lines 302 by the isolation layer pattern 305.

A semiconductor substrate such as a silicon substrate, a germanium substrate, a silicon-germanium substrate, an SOI substrate or a GOI substrate may be used as the substrate 300.

The impurity region may be formed by an ion-implantation process. For example, n-type impurities may be implanted through the upper portion of the substrate 300 to form the impurity region.

The isolation layer pattern 305 may be formed by a shallow trench isolation (STI) process. For example, trenches 307 may be formed on the substrate 300, and an isolation layer sufficiently filling the trenches 307 may be formed on the substrate 300. An upper portion of the substrate 300 may be planarized until a top surface of the substrate 300 is exposed to form the isolation layer pattern 305. The isolation layer may be formed of, e.g., a silicon oxide-based insulation material In example embodiments, the trench 307 may extend in the first direction, and a plurality of the trenches 307 may be formed along the second direction. Accordingly, a plurality of the first conductive lines 302 and the isolation layer patterns 305 extending in the first direction may be formed along the second direction.

In some embodiments, the isolation layer pattern 305 may be formed by an STI process, and then an ion-implantation process may be performed to form the first conductive lines 302.

Figure 25:
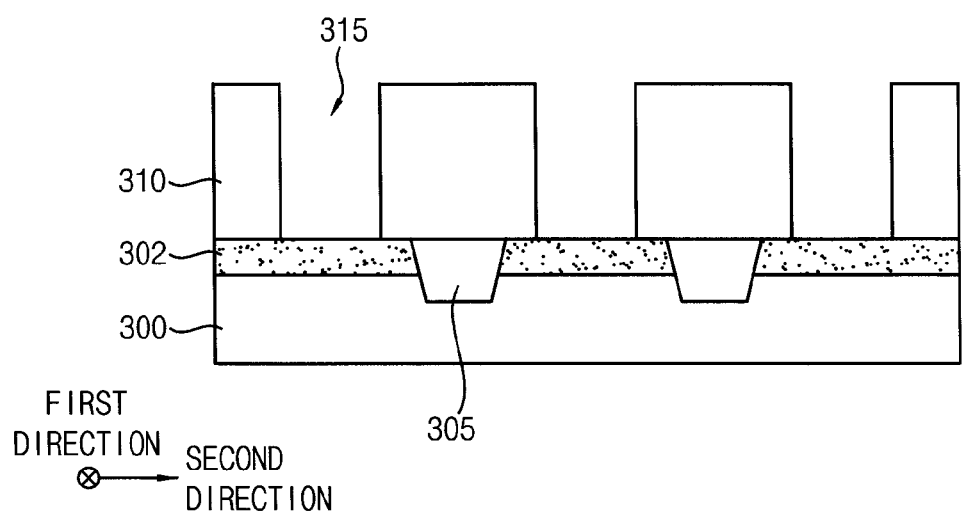

Referring to FIG. 25, a first insulating interlayer 310 may be formed on the first conductive line 302 and the isolation layer pattern 305. The first insulating interlayer 310 may be partially removed to form a first opening 315.

In example embodiments, the first opening 315 may have a hole shape exposing a top surface of the first conductive line 302. A plurality of the first openings 315 may be formed along the first direction to define a first opening column. The first opening column may be formed per each of the first conductive lines 302 such that a first opening array may be defined.

Figure 26:
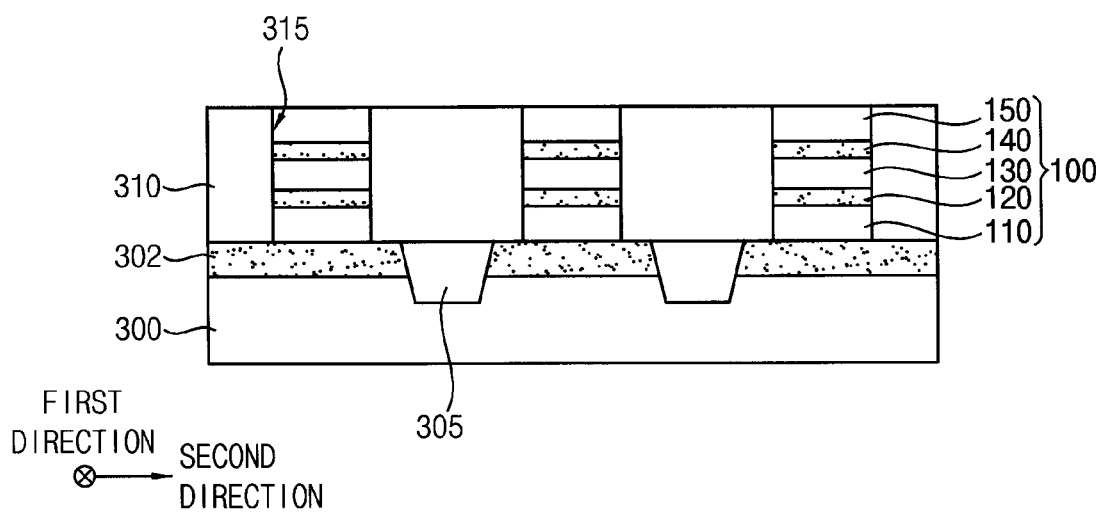

Referring to FIG. 26, a semiconductor diode 100 may be formed in the first opening 315.

In example embodiments, a first semiconductor pattern 110 filling a lower portion of the first opening 315. For example, the first semiconductor pattern 110 may be formed by an SEG process in which the top surface of the first conductive line 302 exposed through the first opening 315 may be used as a seed. A first impurity, e.g., an n-type impurity may be implanted during the SEG process. In an example embodiment, if the first conductive line 302 includes the n-type impurities, a portion of the n-type impurities included in the first conductive line 302 may be diffused into the first semiconductor pattern 110. In such an embodiment, the implantation of the first impurity may be omitted while performing the SEG process.

A carbon-containing dopant may be implanted or deposited on the first semiconductor pattern 110 to form a first diffusion barrier pattern 120. In some embodiments, the first diffusion barrier pattern 120 may be formed by an SEG process in which a carbon-containing gas such as methyl silane, methane or ethane may be used. Accordingly, the diffusion barrier pattern 120 may be grown from a top surface of the first semiconductor pattern 110 to include a carbon-doped silicon material or silicon carbide.

In an example embodiment, before the formation of the first diffusion barrier pattern 120, a surface of the first semiconductor pattern 110 may be cleaned using an acid solution such as a fluoric acid solution.

Subsequently, an intrinsic semiconductor layer may be formed filling a remaining portion of the first opening 315. The intrinsic semiconductor layer may be formed using polysilicon that is not doped with impurities by, e.g., a sputtering process or an ALD process. An upper portion of the intrinsic semiconductor layer may be removed by, e.g., an etch-back process to form an intrinsic semiconductor pattern 130 partially filling the first opening 315 on the first diffusion barrier pattern 120.

A second diffusion barrier pattern 140 may be formed on the intrinsic semiconductor pattern 130 by a process substantially the same as or similar to that for the first diffusion barrier pattern 120.

A second semiconductor layer may be formed on the second diffusion barrier pattern 140 to sufficiently fill the first opening 315. The second semiconductor layer may be formed of, e.g., polysilicon including a second impurity (e.g., a p-type impurity). An upper portion of the second semiconductor layer may be planarized until a top surface of the first insulating interlayer 310 is exposed by, e.g., a CMP process to form a second semiconductor pattern 150 filling an upper portion of the first opening 315.

Accordingly, the semiconductor diode 100 including the first semiconductor pattern 110, the first diffusion barrier pattern 120, the intrinsic semiconductor pattern 130, the second diffusion barrier pattern 140 and the second semiconductor pattern 150 sequentially stacked on each other may be formed in each of the openings 315. A plurality of the semiconductor diodes 100 may form a semiconductor diode array comparable to the first opening array.

In some embodiments, an annealing process may be further performed so that the impurities contained in the semiconductor diode 100 may be uniformly distributed. While performing the annealing process, the first and second impurities may be blocked by the first and second diffusion barrier patterns 120 and 140 to be prevented or inhibited from being diffused into the intrinsic semiconductor pattern 130.

In some embodiments, a silicon-based material included in the semiconductor diode 100 may be crystallized by the annealing process.

Figure 27:
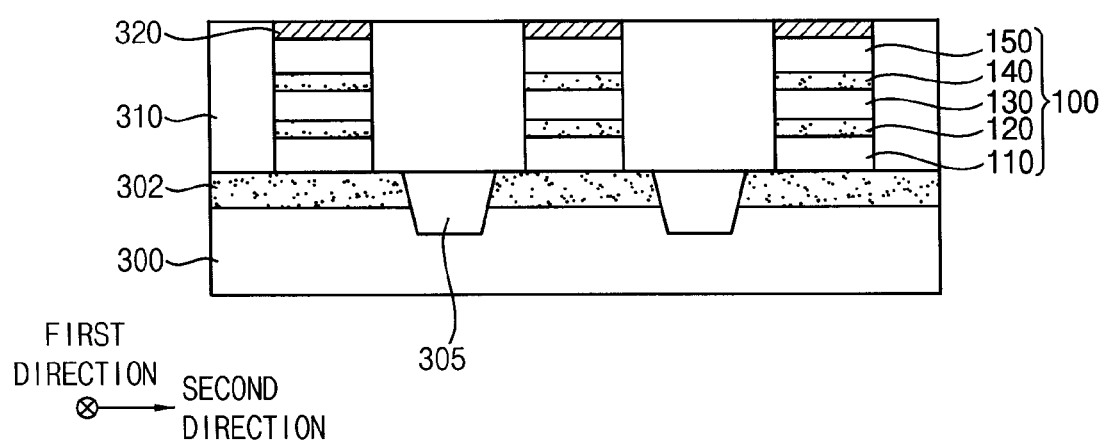

Referring to FIG. 27, an ohmic pattern 320 may be formed on the second semiconductor pattern 150.

For example, a metal layer covering the second semiconductor pattern 150 may be formed on the first insulating interlayer 310. The metal layer may be formed using cobalt, tungsten or nickel by a sputtering process or an ALD process. A thermal treatment may be performed to cause a reaction between the metal layer and a silicon ingredient of the second semiconductor pattern 150. Accordingly, an upper portion of the second semiconductor pattern 150 may be transformed into the ohmic pattern 320 including a metal silicide such as cobalt silicide, tungsten silicide or nickel silicide. A portion of the metal layer which may not participate in the reaction may be removed by, e.g., a CMP process after the formation of the ohmic pattern 320.

Figure 28:
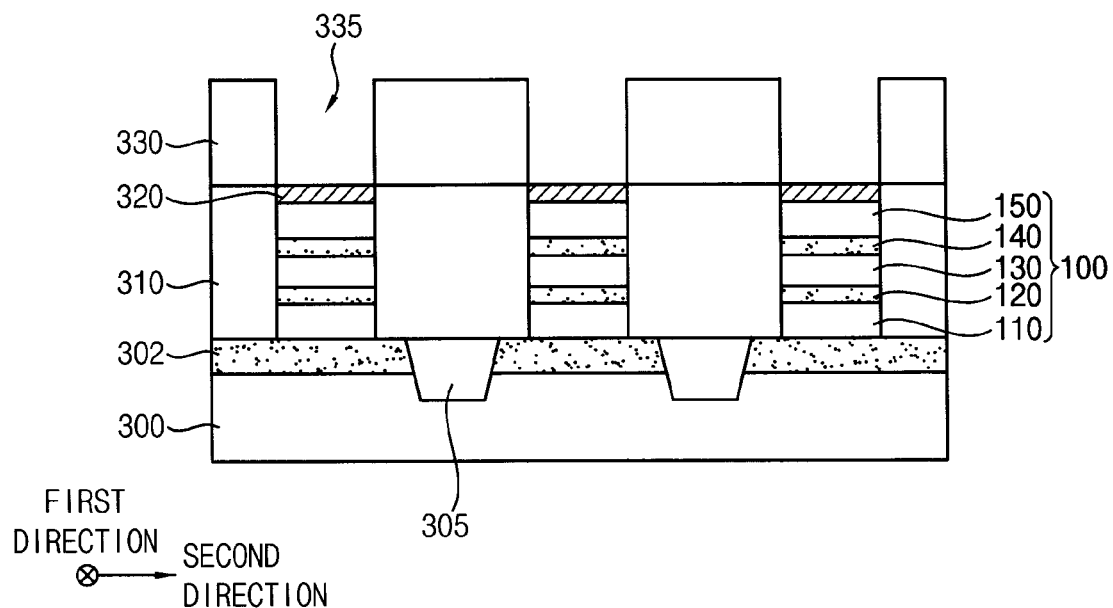

Referring to FIG. 28, a second insulating interlayer 330 covering the semiconductor diode 100 may be formed on the first insulating interlayer 310. The second insulating interlayer 330 may be partially removed to form a second opening 335.

The second insulating interlayer 330 may be formed of a silicon oxide-based material substantially the same as or similar to that of the first insulating interlayer 310.

In example embodiments, a top surface of the ohmic pattern 320 may be exposed through the second opening 335. If the ohmic pattern 320 is omitted, a top surface of the second semiconductor pattern 150 may be exposed through the second opening 335.

The second openings 335 may be formed in an arrangement substantially the same as or similar to that of the first opening 315. Accordingly, a second opening array substantially comparable to the first opening array may be formed. In an example embodiment, the second opening 335 may have a width or a cross-section smaller than that of the first opening 315.

Figure 29:
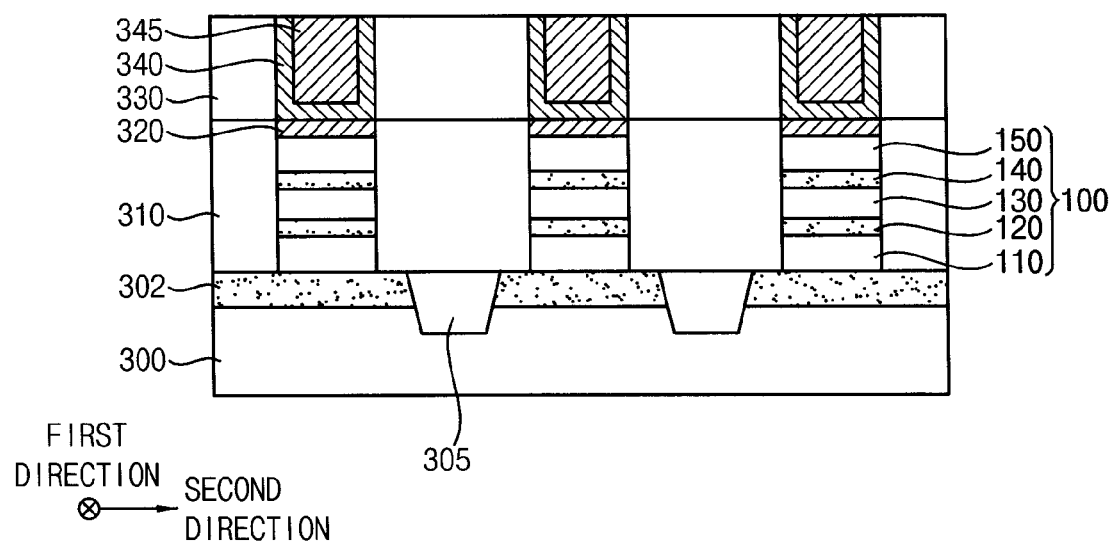

Referring to FIG. 29, a barrier conductive layer pattern 340 and a lower electrode 345 may be formed in the second opening 335.

For example, a barrier conductive layer may be formed on a top surface of the second insulating interlayer 330, and on sidewalls and bottoms of the second openings 335. The barrier conductive layer may be in contact with the ohmic pattern 320. A lower electrode layer filling a remaining portion of the second opening 335 may be formed on the barrier conductive layer. Upper portions of the barrier conductive layer and the lower electrode layer may be planarized until the top surface of the second insulating interlayer 330 is exposed to form the barrier conductive layer pattern 340 and the lower electrode 345.

The barrier conductive layer pattern 340 may have a cup shape fitting into the second opening 335. The lower electrode 345 may have a pillar shape accommodated in the barrier conductive layer pattern 340.

The barrier conductive layer may be formed of a metal or a metal nitride such as titanium, titanium nitride, tantalum, tantalum nitride, etc. The lower electrode layer may be formed of a metal having a low resistance such as copper, tungsten or aluminum. The barrier conductive layer and the lower electrode layer may be formed by a sputtering process or an ALD process.

In an example embodiment, the formation of the barrier conductive layer pattern 340 may be omitted. In this case, the lower electrode 345 may be in contact with the ohmic pattern 320.

Figure 30:
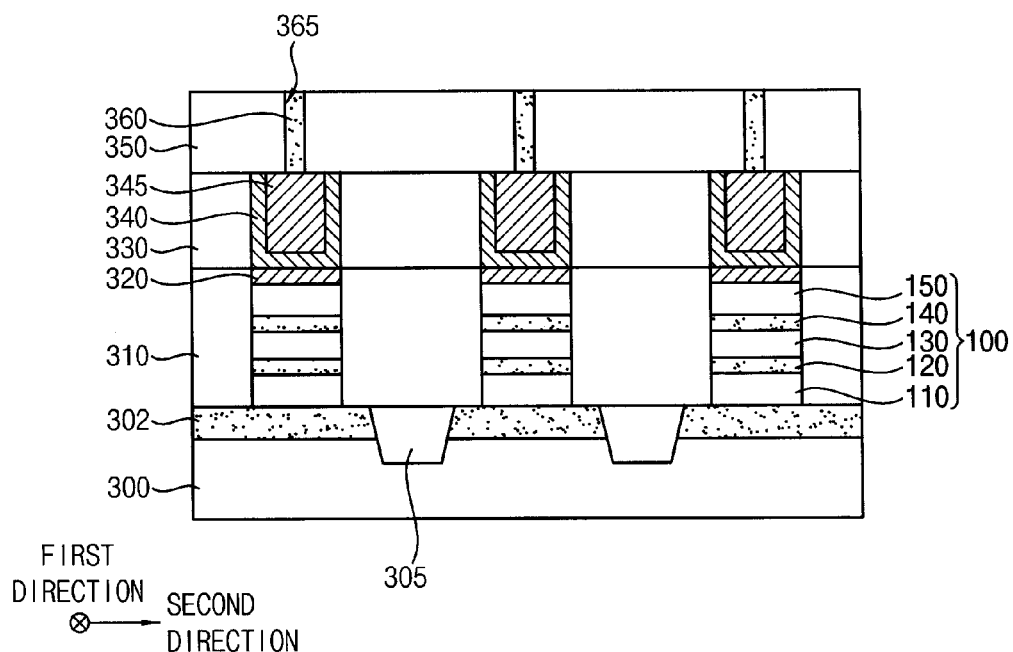

Referring to FIG. 30, a third insulating interlayer 350 covering the lower electrode 345 may be formed on the second insulating interlayer 330. A phase change material pattern 360 may be formed through the third insulating interlayer 350 to be in contact with the lower electrode 345.

In example embodiments, the third insulating interlayer 350 may be formed of a silicon oxide-based material, and then the third insulating interlayer 350 may be partially removed to form a third opening. The third opening 365 may be a hole shape through which a top surface of the lower electrode 345 may be partially exposed. The third opening 365 may have a width or a cross-section smaller than those of the first opening 315 and/or the second opening 335.

A phase change material layer filling the third opening 365 may be formed on a top surface of the third insulating interlayer 350, and on sidewalls and bottoms of the third openings 365. The phase change material layer may be in contact with the lower electrode 345. An upper portion of the phase change material layer may be planarized to form the phase change material pattern 360.

The phase change material layer may be formed of the above-mentioned chalcogenide-based material by, e.g., a CVD process, a sputtering process or an ALD process.

Figure 31:
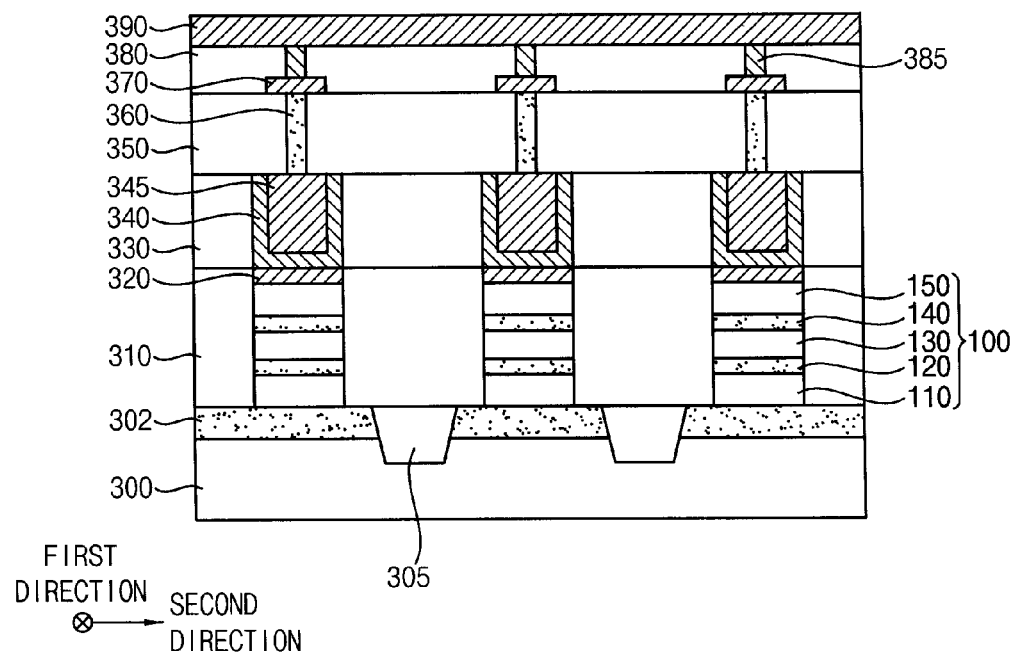

Referring to FIG. 31, an upper electrode 370 contacting the phase change material pattern 360 may be formed on the third insulating interlayer 350. Accordingly, a memory cell including the semiconductor diode 100, the lower electrode 345, the phase change material pattern 360 and the upper electrode 370 may be defined. A plurality of the memory cells may be arranged along the first and second directions to form a memory cell array.

A fourth insulating interlayer 380 covering the upper electrodes 370 may be formed on the third insulating interlayer 350. A contact 385 may be formed through the fourth insulating interlayer 380 to be in contact with each upper electrode 370.

A conductive layer covering the contacts 385 may be formed on the fourth insulating interlayer 380, and may be patterned to form a second conductive line 390. The second conductive line 390 may extend in the second direction and may be electrically connected to a plurality of the contacts 385. A plurality of the second conductive lines 390 may be formed along the first direction.

The upper electrode 370, the contact 385 and the conductive layer may be formed of a metal such as titanium, tantalum or tungsten, or a nitride thereof by a sputtering process or an ALD process.

In some embodiments, the first to fourth insulating interlayers 310, 330, 350 and 380 may be formed of the silicon-oxide based material such as PEOX, TEOS, BTEOS, PTEOS, BPTEOS, BSG, PSG, BPSG, or the like, and at least two layers of the first to fourth insulating interlayers 310, 330, 350 and 380 may be merged with each other.

Figure 32:
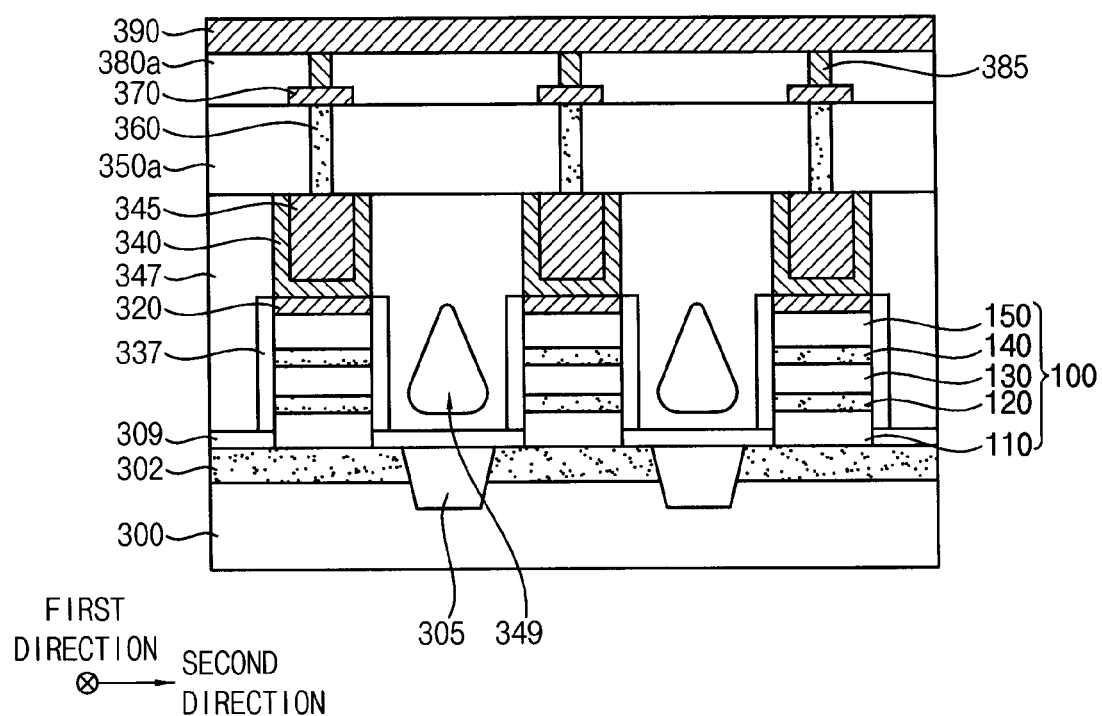

FIG. 32 is a cross-sectional view illustrating a variable resistance memory device in accordance with example embodiments. The variable resistance memory device of FIG. 32 may have elements and/or constructions substantially the same as or similar to those of the variable resistance memory device of FIG. 23 except for an addition of an etch-stop layer, a spacer and an air gap. Thus, detailed descriptions on repeated elements and/or structures are omitted herein, and like reference numerals are used to designate like elements.

Referring to FIG. 32, an etch-stop layer 309 may be formed on a substrate 300 to cover a first conductive line 302 and an isolation layer pattern 305. Accordingly, an etching damage of the first conductive line and an active region of the substrate 300 may be prevented or inhibited. The etch-stop layer 309 may surround a lower portion of a semiconductor diode 100. For example, the etch-stop layer 309 may be formed on a sidewall of a first semiconductor pattern 100 included in the semiconductor diode 100.

The etch-stop layer 309 may include, e.g., silicon nitride or silicon oxynitride.

A spacer 337 may be formed on a sidewall of the semiconductor diode 100. The spacer 337 may be formed on the etch-stop layer 309 and surround the semiconductor diode 100.

In example embodiments, the spacer 337 may include a carbon-containing insulation material such as silicon carbonitride or silicon carbooxide. An impurity diffusion from lateral portions of first and second semiconductor patterns 110 and 150 may be suppressed by the spacer 337.

In an example embodiment, the spacer 337 may be also formed on a sidewall of an ohmic pattern 320. The spacer 337 may extend to a sidewall of a barrier conductive layer pattern 340.

An insulation layer 347 may be formed on the etch-stop layer 309. A lower electrode 345, the barrier conductive layer pattern 340 and the semiconductor diode 100 may be formed in the insulation layer 347.

The insulation layer 347 may include an insulation material having undesirable gap-fill property or step coverage. For example, the insulation layer 347 may include silicon oxide such as TEOS or a CVD oxide. Thus, an air gap 349 may be formed in a portion of the insulation layer 347 between the neighboring semiconductor diodes 100.

For example, a plurality of the air gaps 349 may be formed along the first and second directions to form an air gap array. In some embodiments, four air gaps 349 may be arranged around one semiconductor diode 100.

The air gap 349 may be formed substantially between the neighboring spacers 337. As described above, if the spacer 337 extends to the sidewall of the barrier conductive layer pattern 340, a height of the air gap 349 may be also increased.

A third insulating interlayer 350a may be formed on the insulation layer 347. A phase change material layer pattern 360 may extend through the third insulating interlayer 350a to contact the lower electrode 345. An upper electrode 370 may be disposed on the third insulating interlayer 350a to contact the phase change material pattern 360.

A fourth insulating interlayer 380a may be formed on the third insulating interlayer 350a to cover the upper electrode 370. A contact 385 may extend through the fourth insulating interlayer 380a to be electrically connected to the upper electrode 370. A second conductive line 390 may be disposed on the fourth insulating interlayer 380a to be electrically connected to a plurality of the contacts 385.

FIGS. 33 to 40 are cross-sectional views illustrating a method of manufacturing a variable resistance memory device in accordance with example embodiments. For example, FIGS. 33 to 40 illustrate a method of manufacturing the variable resistance memory device of FIG. 32.

Detailed descriptions on processes and/or materials substantially the same as or similar to those illustrated with reference to FIGS. 24 to 31 are omitted herein.

Figure 33:
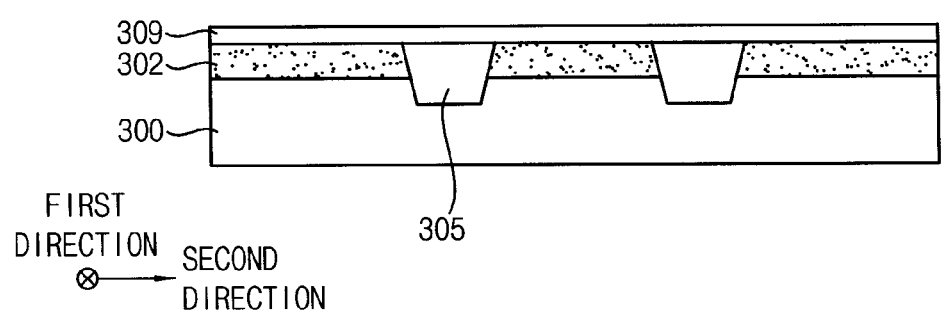

Referring to FIG. 33, a process substantially the same as or similar to that illustrated with reference to FIG. 24 may be performed to form a first conductive line 302 and an isolation layer pattern 305 at an upper portion of a substrate 300.

An etch-stop layer 309 covering the first conductive line 302 and the isolation layer pattern 305 may be formed on the substrate 300. The etch-stop layer 309 may be formed of, e.g., silicon nitride or silicon oxynitride by, e.g., a CVD process, a PECVD process or a spin coating process.

Figure 34:
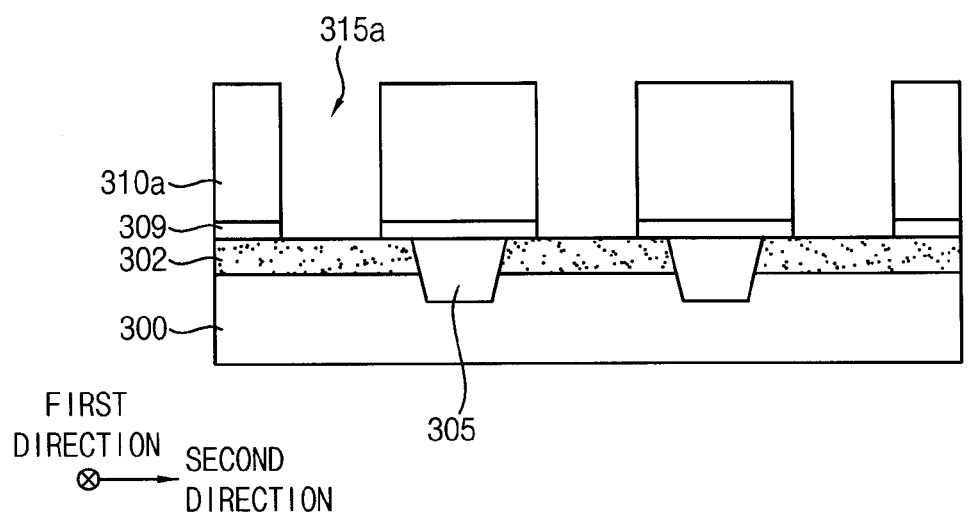

Referring to FIG. 34, a process substantially the same as or similar to that illustrated with reference to FIG. 25 may be performed. Accordingly, a first insulating interlayer 310a may be formed on the etch-stop layer 309, and the first insulating interlayer 310a and the etch-stop layer 309 may be partially removed to form a first opening 315a. The first conductive line 302 may be exposed through the first opening 315a. A plurality of the first opening 315a may be formed on the first conductive lines 302 along the first and second directions to form a first opening array.

The first insulating interlayer 310a may be formed of silicon oxide by a CVD process or a spin coating process.

Figure 35:
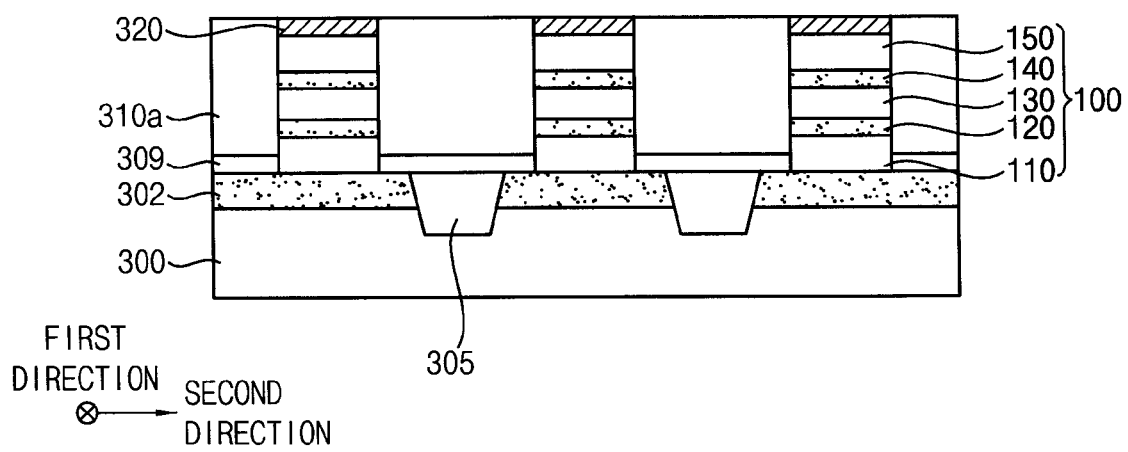

Referring to FIG. 35, processes substantially the same as or similar to those illustrated with reference to FIGS. 26 and 27 may be performed. Accordingly, a semiconductor diode 100 including a first semiconductor pattern 110, a first diffusion barrier pattern 120, an intrinsic semiconductor pattern 130, a second diffusion barrier pattern 140 and a second semiconductor pattern 150 sequentially stacked on each other may be formed in the first opening 315a. An ohmic pattern 320 may be further formed on the semiconductor diode 100.

Figure 36:
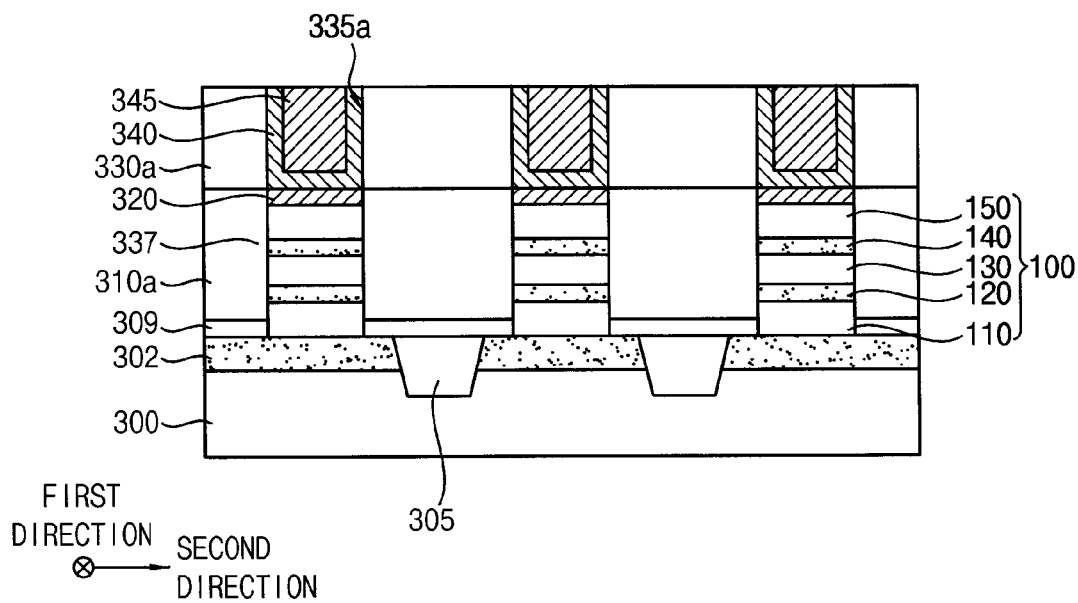

Referring to FIG. 36, processes substantially the same as or similar to FIGS. 28 and 29 may be performed.

Accordingly, a second insulating interlayer 330a covering the ohmic pattern 320 or the semiconductor diode 100 may be formed on the first insulating interlayer 310a. The second insulating interlayer 330a may be formed of silicon oxide substantially the same as or similar to that of the first insulating interlayer 310a. In some embodiments, the first and second insulating interlayers 310a and 330a may be merged with each other.

The second insulating interlayer 330a may be partially removed to form a second opening 335a through which the ohmic pattern 320 may be exposed. A barrier conductive layer pattern 340 and a lower electrode 345 may be formed in the second opening 335a.

Figure 37:
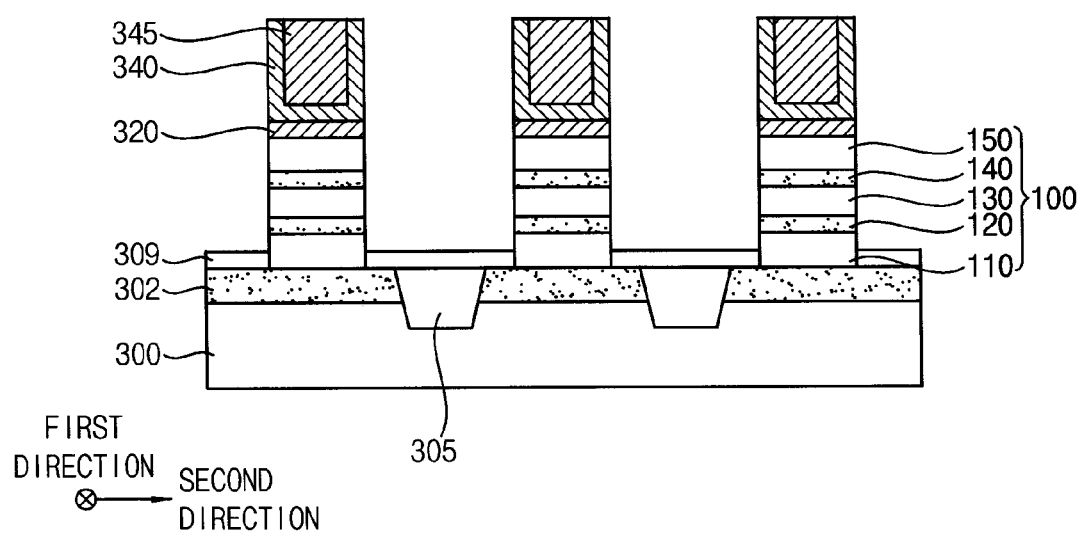

Referring to FIG. 37, the first and second insulating interlayers 310a and 330a may be removed. In example embodiments, the first and second insulating interlayers 310a and 330a may be removed by a wet etching process using an etchant solution that may have an etching selectivity for silicon oxide. For example, the etchant solution may include a fluoric acid solution or a buffer oxide etchant (BOE) solution.

Sidewalls of the semiconductor diodes 100 may be cleaned or washed while removing the first and second insulating interlayers 310a and 330a by the etchant solution. Thus, impurities diffused and mixed in the sidewall of the semiconductor diode 100 may be removed.

After the removal of the first and second insulating interlayers 310a and 330a, a pillar structure including the semiconductor diode 100 and the lower electrode 345 may protrude from the substrate 300. As described above, the first and second insulating interlayers 310a and 330a may serve as sacrificial layers that are removed for subsequent processes.

Figure 38:
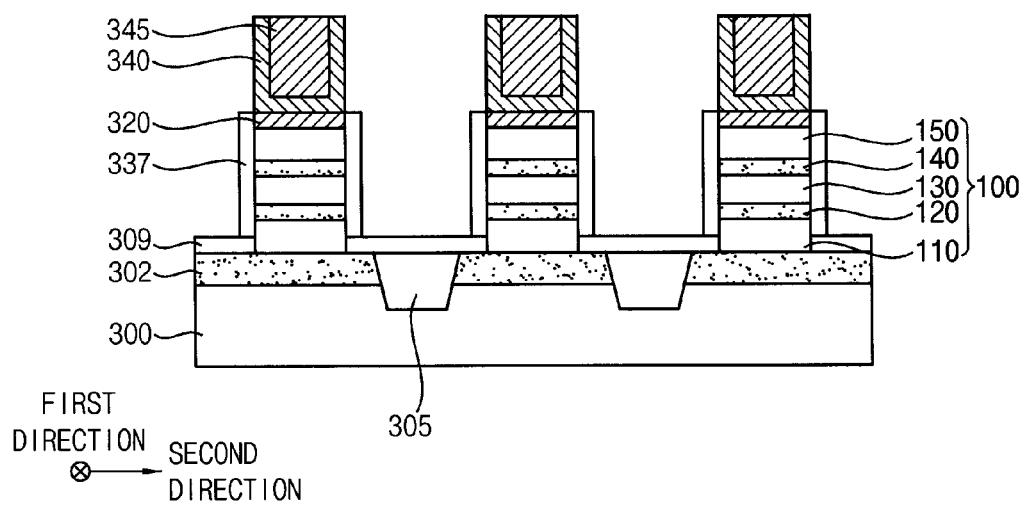

Referring to FIG. 38, a spacer 337 may be formed on the sidewall of the semiconductor diode 100.

In example embodiments, a spacer layer may be formed conformably on sidewalls of the semiconductor diode 100, the ohmic pattern 320 and the barrier conductive layer pattern 340, and on top surfaces of the lower electrode 345 and etch-stop layer 309. Upper and lower portions of the spacer layer may be removed by an anisotropic etching process and/or an etch-back process to form the spacer 337.

In example embodiments, the spacer layer may be formed of a carbon-containing insulation material such as silicon carbooxide or silicon carbonitride by an ALD process or a sputtering process.

In some embodiments, the spacer 337 may be also formed on a sidewall of the ohmic pattern 320. The spacer 337 may extend to a sidewall of the barrier conductive layer pattern 340.

For example, the spacer 337 including carbon may be formed on the semiconductor diode 100 so that an impurity diffusion through sidewalls of the first and second semiconductor patterns 110 and 150 may be avoided during subsequent processes performed at a high temperature.

Figure 39:
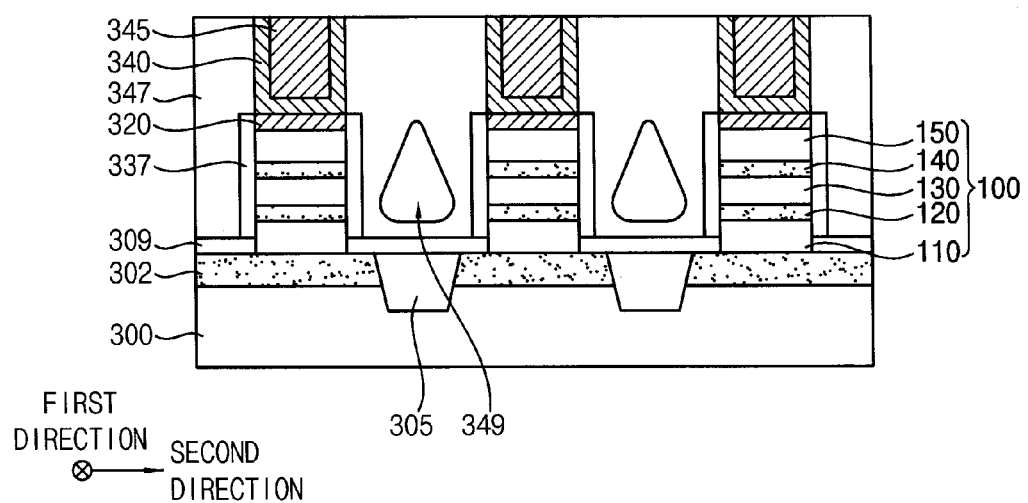

Referring to FIG. 39, an insulation layer 347 covering the spacer 337, the semiconductor diode 100, the ohmic pattern 320, the barrier conductive layer pattern 340 and the lower electrode 345 may be formed on the etch-stop layer 309. An upper portion of the insulation layer 347 may be planarized until a top surface of the lower electrode 345 is exposed.

The insulation layer 347 may be formed using an insulation material and a process condition having undesirable gap-fill property and step coverage. For example, the insulation layer 347 may be formed of silicon oxide such as TEOS or a CVD oxide by a CVD process or a spin coating process.

A width between the neighboring semiconductor diodes 100 may be reduced by the formation of the spacer 337 relatively to a width between the neighboring barrier conductive layer patterns 340. Accordingly, an air gap 349 may be formed in a portion of the insulation layer 347 between the neighboring semiconductor diodes 100. For example, the insulation layer 347 may be overhung by the spacers 337.

For example, a plurality of the air gaps 349 may be formed along the first and second directions to form an air gap array. In some embodiments, four air gaps 349 may be formed around one semiconductor diode 100.

The air gap 349 may be formed substantially between the neighboring spacers 337. As described above, if the spacer 337 extends to a lateral portion of the barrier conductive layer pattern 340, a height of the air gap 349 may be also increased. For example, the air gap 349 may extend to a portion of the insulation layer 347 between the neighboring lower electrodes 345.

Figure 40:
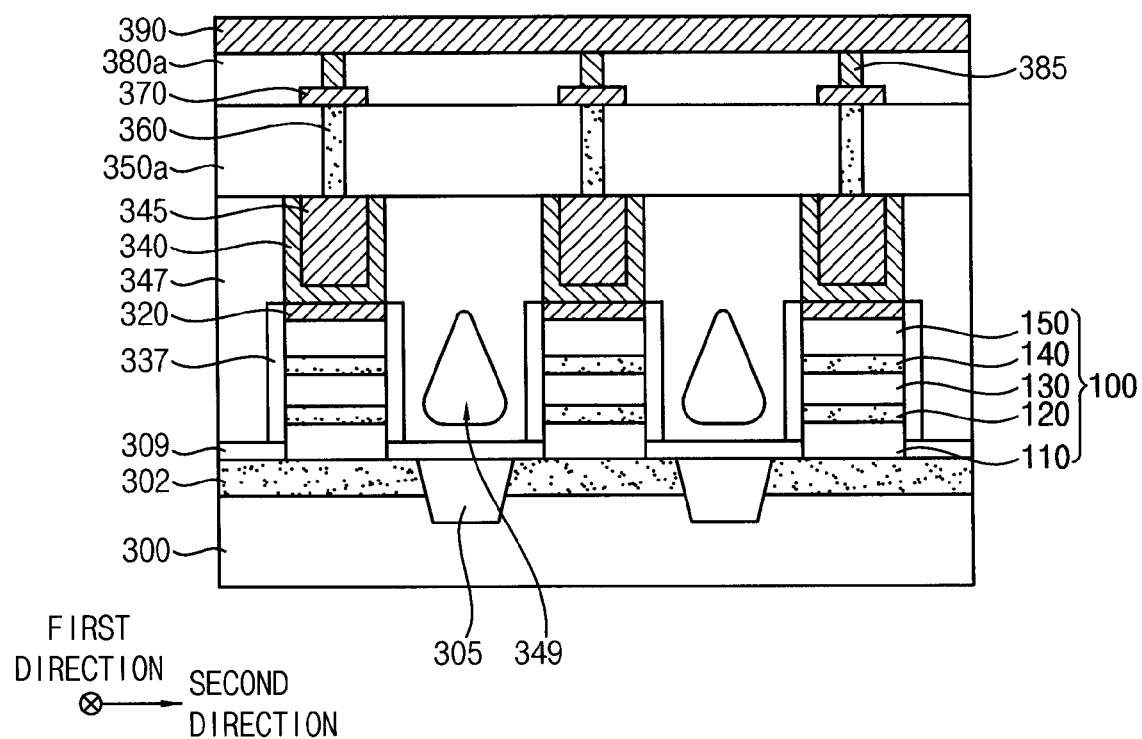

Referring to FIG. 40, processes substantially the same as or similar to those illustrated with reference to FIGS. 30 and 31 may be performed.

Accordingly, a third insulating interlayer 350a may be formed on the insulation layer 347. A phase change material pattern 360 may be formed through the third insulating interlayer 350a. The phase change material pattern 360 may be in contact with the lower electrode 345.

An upper electrode 370 contacting the phase change material pattern 360 may be formed on the third insulating interlayer 350a. A fourth insulating interlayer 380a covering the upper electrode 370 may be formed on the third insulating interlayer 350a. A contact 385 may be formed through the fourth insulating interlayer 380a to be electrically connected to the upper electrode 370.

A second conductive line 390 electrically connected to a plurality of the contacts 385 may be formed on the fourth insulating interlayer 380a.

Figure 41:
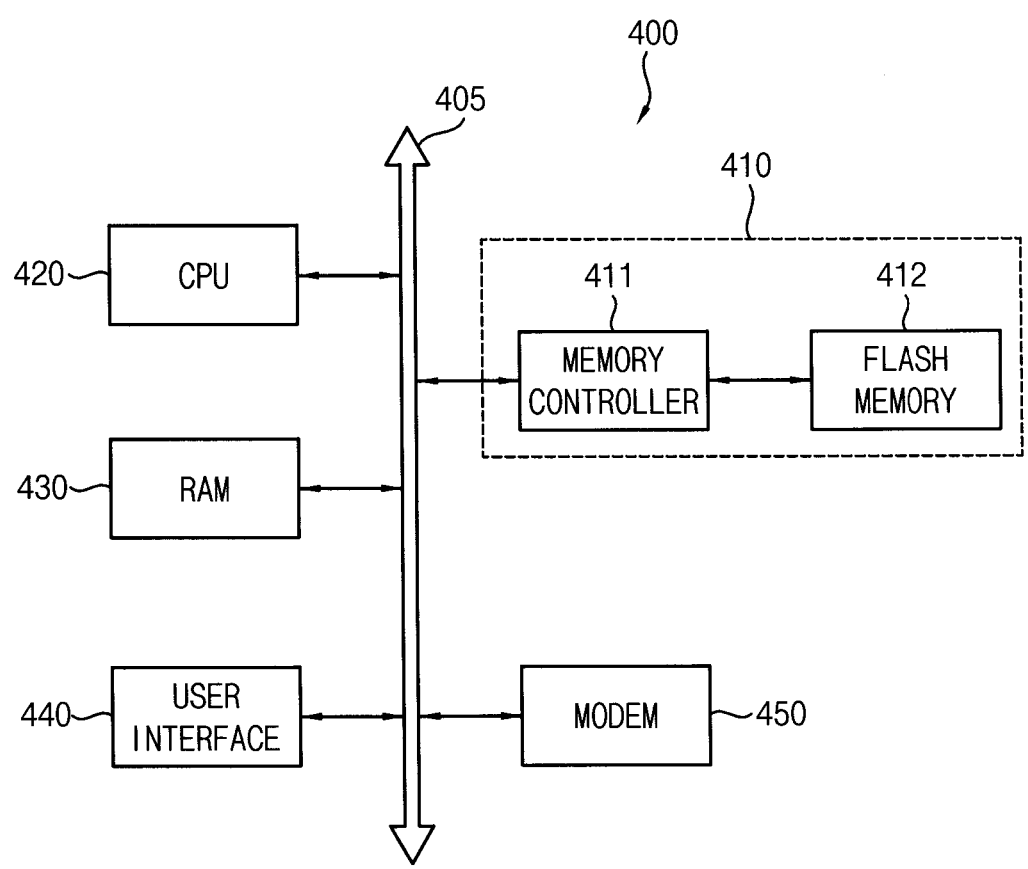

FIG. 41 is a block diagram illustrating a schematic construction of an information processing system in accordance with example embodiments.

Referring to FIG. 41, an information processing system 400 may include a CPU 420, a RAM 430, an user interface 440, a modem 450 such as a baseband chipset and a memory system 410 electrically connected to a system bus 405. The memory system 410 may include a memory device 412 and a memory controller 411. The memory device 412 may include the variable resistance memory device in accordance with example embodiments. Thus, large data processed by the CPU 420 or input from an external device may be stored in the memory device 412 with high stability. The memory controller 411 may have a construction capable of controlling the memory device 412. The memory system 410 may be provided as, e.g., a memory card or a solid state disk (SSD) by a combination of the memory device 412 and the memory controller 411. The memory device 412 and the memory controller 411 may be provided as a package-on-package (POP) structure.

In a case that the information processing system 400 is implemented to a mobile device, a battery may be further provided for supplying an driving voltage of the information processing system 400. The information processing system 400 may further include an application chipset, a camera image processor (CIS), a mobile DRAM, etc. The information processing system 400 may be implemented to a mobile phone, an MP3 player, various electronic devices, etc.

According to example embodiments of the present inventive concepts, diffusion barrier patterns or dopant regions may be formed between semiconductor patterns of a semiconductor diode. Thus, an impurity diffusion in the semiconductor diode may be suppressed so that an operational reliability of the semiconductor diode may be improved. The semiconductor diode may be implemented to memory cells arranged in, e.g., a cross-point structure to improve an operational property of each memory cell. The semiconductor diode in accordance with example embodiments may be implemented to various types of non-volatile semiconductor devices such as a ReRAM device, an MRAM device or a PRAM device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device, comprising:
a plurality of first conductive lines extending in a first direction;
a plurality of second conductive lines over the first conductive lines, the second conductive lines extending in a second direction crossing the first direction; and
a plurality of memory cells at intersection regions of the first conductive lines and the second conductive lines, each of the memory cells including,
a semiconductor diode including a first semiconductor pattern, a first diffusion barrier pattern, an intrinsic semiconductor pattern, a second diffusion barrier pattern and a second semiconductor pattern sequentially stacked on the first conductive lines, the first semiconductor pattern including a first impurity and the second semiconductor pattern including a second impurity; and
a variable resistance pattern on the semiconductor diode,
wherein the first diffusion barrier pattern and the second diffusion barrier pattern include at least one of polysilicon doped with carbon and silicon carbide, and
wherein the variable resistance pattern includes one of a perovskite-based material and a transition metal oxide.

2. The variable resistance memory device of claim 1, further comprising:
a spacer surrounding a sidewall of the semiconductor diode.

3. The variable resistance memory device of claim 2, wherein the spacer includes a carbon-containing insulation material.

4. The variable resistance memory device of claim 3, wherein the spacer includes one of silicon carbooxide and silicon carbonitride.

5. The variable resistance memory device of claim 2, wherein the spacer includes:
a first spacer on sidewalls of the memory cells and the first conductive lines; and
a second spacer on sidewalls of the memory cells and the second conductive lines.

6. The variable resistance memory device of claim 2, further comprising:
an insulation layer pattern on the spacer and surrounding the memory cells,
wherein the insulation layer pattern defines an air gap between the memory cells neighboring each other.

7. The variable resistance memory device of claim 6, wherein the air gap includes a first air gap extending in the first direction and a second air gap extending in the second direction.

8. A variable resistance memory device, comprising:
a plurality of first conductive lines extending in a first direction;
a plurality of second conductive lines over the first conductive lines, the second conductive lines extending in a second direction crossing the first direction; and
a plurality of memory cells at intersection regions of the first conductive lines and the second conductive lines, each of the memory cells including,
a semiconductor diode including a first semiconductor pattern, an intrinsic semiconductor pattern and a second semiconductor pattern sequentially stacked on the first conductive lines, and a plurality of dopant regions distributed throughout the first semiconductor pattern, the intrinsic semiconductor pattern and the second semiconductor pattern, the first semiconductor pattern including a first impurity and the second semiconductor pattern including a second impurity, the dopant regions including,
a first dopant region at a region adjacent to an interface of the first semiconductor pattern and the intrinsic semiconductor pattern, the first dopant region including carbon, and
a second dopant region at a region adjacent to an interface of the second semiconductor pattern and the intrinsic semiconductor pattern, the second dopant region including carbon, and
a variable resistance pattern on the semiconductor diode,
wherein the dopant regions are maximum dopant regions, the maximum dopant regions corresponding with maximum concentration peaks of a dopant in the semiconductor diode.

9. A semiconductor diode, comprising:
a first semiconductor pattern doped with a first type impurity and a second semiconductor pattern doped with a second type impurity different than the first type impurity;
an intrinsic semiconductor pattern between the first and second semiconductor patterns; and
carbon doped regions at an interface of the intrinsic semiconductor pattern and each of the first and second semiconductor patterns,
wherein a concentration of the carbon doped regions decreases as a distance from the interface of the intrinsic semiconductor pattern and each of the first and second semiconductor patterns increases.

10. The semiconductor diode of claim 9, wherein the carbon doped regions include at least one of polysilicon doped with carbon, and silicon carbide.

11. The semiconductor diode of claim 9, wherein the first type impurity includes an n-type impurity and the second type impurity includes a p-type impurity.

12. The semiconductor diode of claim 9, wherein the carbon doped regions are maximum carbon doped regions, the maximum carbon doped regions corresponding with maximum concentration peaks of a dopant in he semiconductor diode.

* * * * *